(12) United States Patent
Kimura

(10) Patent No.: US 11,670,241 B2
(45) Date of Patent: Jun. 6, 2023

(54) DISPLAY ELEMENT, DISPLAY DEVICE, AND ELECTRONIC DEVICE

(71) Applicant: Sony Group Corporation, Tokyo (JP)

(72) Inventor: Kei Kimura, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 17/859,751

(22) Filed: Jul. 7, 2022

(65) Prior Publication Data
US 2022/0343860 A1    Oct. 27, 2022

Related U.S. Application Data

(63) Continuation of application No. 17/206,274, filed on Mar. 19, 2021, now Pat. No. 11,404,008, which is a
(Continued)

(30) Foreign Application Priority Data

Sep. 22, 2017    (JP) .............................. JP2017-182677

(51) Int. Cl.
*G09G 3/3266* (2016.01)
*G09G 3/3258* (2016.01)
(Continued)

(52) U.S. Cl.
CPC ......... *G09G 3/3266* (2013.01); *G09G 3/3258* (2013.01); *H10K 59/126* (2023.02); *H10K 59/131* (2023.02); *G09G 2300/0876* (2013.01)

(58) Field of Classification Search
CPC .............. G09G 3/3266; G09G 3/3258; G09G 2300/0876; H01L 27/3272; H01L 27/3276
(Continued)

(56) References Cited

U.S. PATENT DOCUMENTS

2004/0251513 A1* 12/2004 Su ..................... H01L 21/76232
257/510
2012/0205647 A1* 8/2012 Heo .................... H01L 27/3262
257/43
(Continued)

FOREIGN PATENT DOCUMENTS

CN          1862764 A      11/2006
CN        102332535 A       1/2012
(Continued)

OTHER PUBLICATIONS

Chinese Office Action dated Jun. 23, 2021 for corresponding Chinese Application No. 201880059523.X.

*Primary Examiner* — Mark Edwards
(74) *Attorney, Agent, or Firm* — Michael Best & Friedrich LLP

(57) ABSTRACT

A display element includes a light-emitting unit of a current drive type, and a drive unit that drives the light-emitting unit, in which the drive unit includes a capacitance unit, a drive transistor that causes a current corresponding to a voltage held by the capacitance unit to flow through the light-emitting unit, and a write transistor that writes a signal voltage to the capacitance unit, the drive transistor and the write transistor are formed in a state of being separated by an element isolation region, on a semiconductor substrate, and a capacitance generated in a portion where the drive transistor and the write transistor face each other through the element isolation region functions as at least a part of the capacitance unit.

18 Claims, 21 Drawing Sheets

Related U.S. Application Data continuation of application No. 16/647,841, filed as application No. PCT/JP2018/031892 on Aug. 29, 2018, now Pat. No. 10,971,073.

(51) Int. Cl.
*H10K 59/126* (2023.01)
*H10K 59/131* (2023.01)

(58) Field of Classification Search
USPC .......................................................... 345/55
See application file for complete search history.

(56) References Cited

U.S. PATENT DOCUMENTS

| | | | |
|---|---|---|---|
| 2014/0132175 A1 | 5/2014 | Hokazono et al. | |
| 2014/0240370 A1 | 8/2014 | Sakairi et al. | |
| 2015/0206933 A1* | 7/2015 | Koshihara | G09G 3/3225 257/40 |
| 2018/0358339 A1* | 12/2018 | Iguchi | H01L 33/62 |

FOREIGN PATENT DOCUMENTS

| | | |
|---|---|---|
| CN | 102542970 A | 7/2012 |
| CN | 104282688 A | 1/2015 |
| CN | 104934424 A | 9/2015 |
| CN | 105390527 A | 3/2016 |
| CN | 106898301 A | 6/2017 |
| JP | 62-299061 A | 12/1987 |
| JP | 05-034709 A | 2/1993 |
| JP | 2000-137246 A | 5/2000 |
| JP | 2002-277900 A | 9/2002 |
| JP | 2003-280033 A | 10/2003 |
| JP | 2012-173470 A | 9/2012 |
| JP | 2014-098779 A | 5/2014 |
| JP | 2015005342 A * | 1/2015 |
| JP | 2016-053635 A | 4/2016 |
| WO | WO-2019058906 A1 | 3/2019 |

* cited by examiner

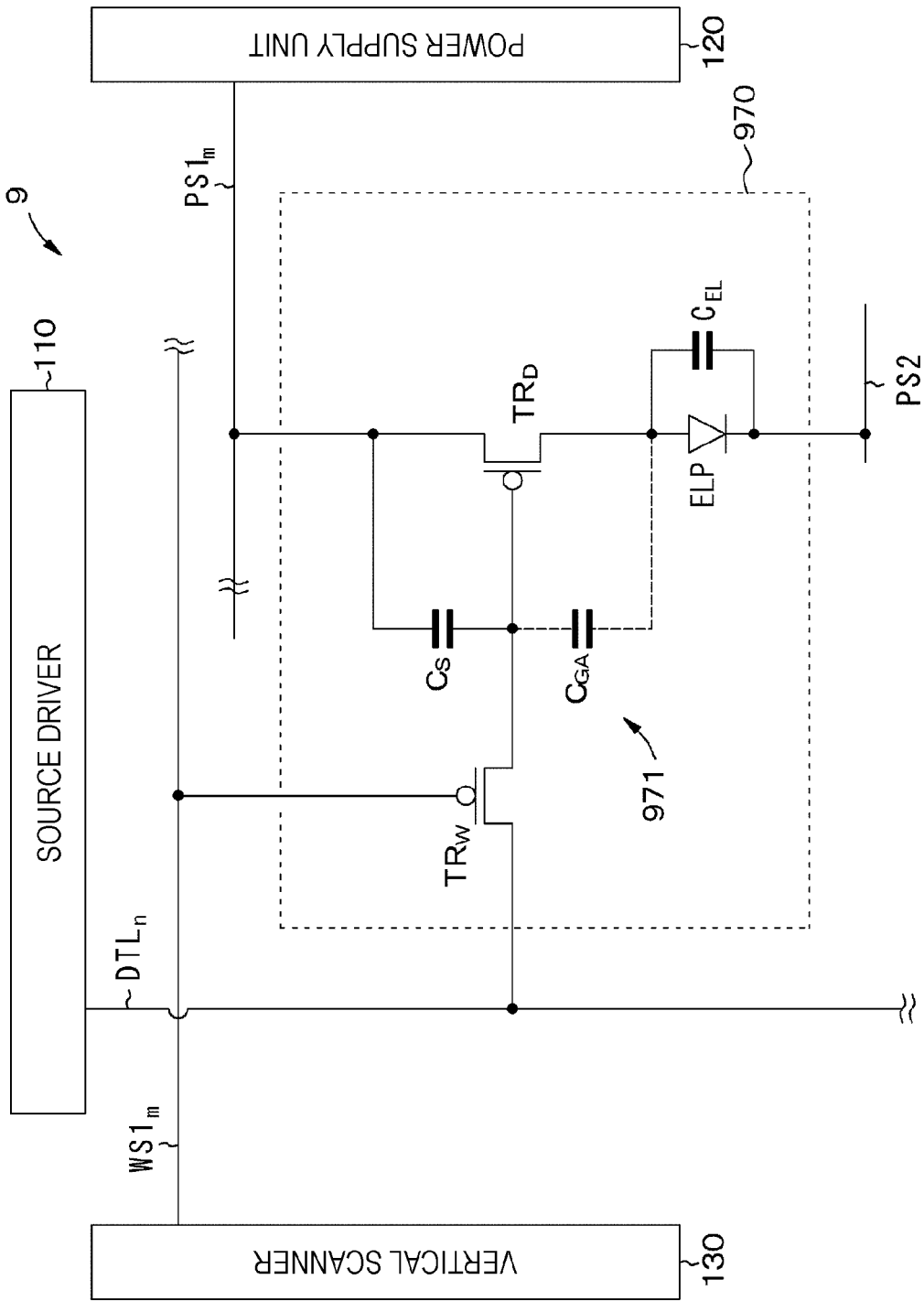

DISPLAY ELEMENT, DISPLAY DEVICE, AND ELECTRONIC DEVICE

CROSS REFERENCES TO RELATED APPLICATIONS

The present application is a Continuation Application of U.S. patent application Ser. No. 17/206,274 filed Mar. 19, 2021, which is a Continuation Application of U.S. patent application Ser. No. 16/647,841 filed Mar. 16, 2020, now U.S. Pat. No. 10,971,073 issued Apr. 6, 2021, which is a 371 National Stage Entry of International Application No.: PCT/JP2018/031892, filed on Aug. 29, 2018, which in turn claims priority from Japanese Application No. 2017-182677, filed on Sep. 22, 2017, the entire contents of which are incorporated herein by reference.

TECHNICAL FIELD

The present disclosure relates to a display element, a display device, and an electronic device. More specifically, the present disclosure relates to a display element used for a micro-display that requires a pixel pitch in units of micrometers, a display device including the display element, and an electronic device including the display device.

BACKGROUND ART

A display element is known including a light-emitting unit of a current drive type, and a display device is known including the display element. For example, a display element including a light-emitting unit including an organic electroluminescence element has been attracting attention as a display element capable of high luminance light emission by low voltage direct current drive. Then, a display device including the organic electroluminescence element is used not only in a direct-view display, but also in a micro-display that requires a pixel pitch in units of micrometers.

To realize a pixel pitch in units of micrometers, a drive unit that drives the light-emitting unit of the current drive type is formed on a semiconductor substrate (see, for example, Patent Document 1). The drive unit includes a plurality of transistors and the like. Thus, to separate adjacent transistors, an element isolation region is required between the transistors. In such an application, a so-called shallow trench isolation (STI) method is preferable capable of forming the element isolation region more finely than a local oxidation of silicon (LOCOS) method.

CITATION LIST

Patent Document

Patent Document 1: Japanese Patent Application Laid-Open No. 2014-98779

SUMMARY OF THE INVENTION

Problems to be Solved by the Invention

As the pixel pitch becomes finer, the distance becomes narrower between the transistors facing each other across the element isolation region. As a result, a capacitance increases generated between the transistors facing across the element isolation region. Then, it is conceivable that a burn-in phenomenon of a display image due to a change with time of the light-emitting unit is emphasized by influence of the capacitance.

Thus, an object of the present disclosure is to provide a display element in which the capacitance generated between the transistors does not emphasize the burn-in phenomenon of the display image, a display device including the display element, and an electronic device including the display device.

Solutions to Problems

A display element according to a first aspect of the present disclosure for achieving the object described above is
a display element including
a light-emitting unit of a current drive type, and a drive unit that drives the light-emitting unit, in which
the drive unit includes a capacitance unit, a drive transistor that causes a current corresponding to a voltage held by the capacitance unit to flow through the light-emitting unit, and a write transistor that writes a signal voltage to the capacitance unit,
the drive transistor and the write transistor are formed in a state of being separated by an element isolation region, on a semiconductor substrate, and
a capacitance generated in a portion where the drive transistor and the write transistor face each other through the element isolation region functions as at least a part of the capacitance unit.

A display device according to the first aspect of the present disclosure for achieving the object described above is
a display device including
display elements arrayed in a two-dimensional matrix, in which
the display elements each include a light-emitting unit of a current drive type, and a drive unit that drives the light-emitting unit,
the drive unit includes a capacitance unit, a drive transistor that causes a current corresponding to a voltage held by the capacitance unit to flow through the light-emitting unit, and a write transistor that writes a signal voltage to the capacitance unit,
the drive transistor and the write transistor are formed in a state of being separated by an element isolation region, on a semiconductor substrate, and
a capacitance generated in a portion where the drive transistor and the write transistor face each other through the element isolation region functions as at least a part of the capacitance unit.

An electronic device according to the first aspect of the present disclosure for achieving the object described above is
an electronic device including
a display device including display elements arrayed in a two-dimensional matrix, in which
the display elements each include a light-emitting unit of a current drive type, and a drive unit that drives the light-emitting unit,
the drive unit includes a capacitance unit, a drive transistor that causes a current corresponding to a voltage held by the capacitance unit to flow through the light-emitting unit, and a write transistor that writes a signal voltage to the capacitance unit,
the drive transistor and the write transistor are formed in a state of being separated by an element isolation region, on a semiconductor substrate, and a capacitance generated in a portion where the drive transistor and the write transistor face each other through the element isolation region functions as at least a part of the capacitance unit.

Effects of the Invention

In the display element of the present disclosure, the drive unit includes the drive transistor that causes the current corresponding to the voltage held by the capacitance unit to flow through the light-emitting unit, and the write transistor that writes the signal voltage to the capacitance unit. Then, the capacitance generated in the portion where the drive transistor and the write transistor face each other through the element isolation region functions as at least a part of the capacitance unit. As a result, it is possible to avoid that the burn-in phenomenon due to influence of the change with time of the voltage-current characteristic (V-I) characteristic of the light-emitting unit of the current drive type is emphasized by the influence of the capacitance. Furthermore, the advantageous effects described in the present disclosure are examples, and are not limited to them and may include additional effects.

BRIEF DESCRIPTION OF DRAWINGS

FIG. 8 is a conceptual diagram of a display device including a display element including the drive unit of the reference example.

FIG. 19A illustrates a front view of the camera and FIG. 19B illustrates a rear view of the camera.

MODE FOR CARRYING OUT THE INVENTION

Figure 1:
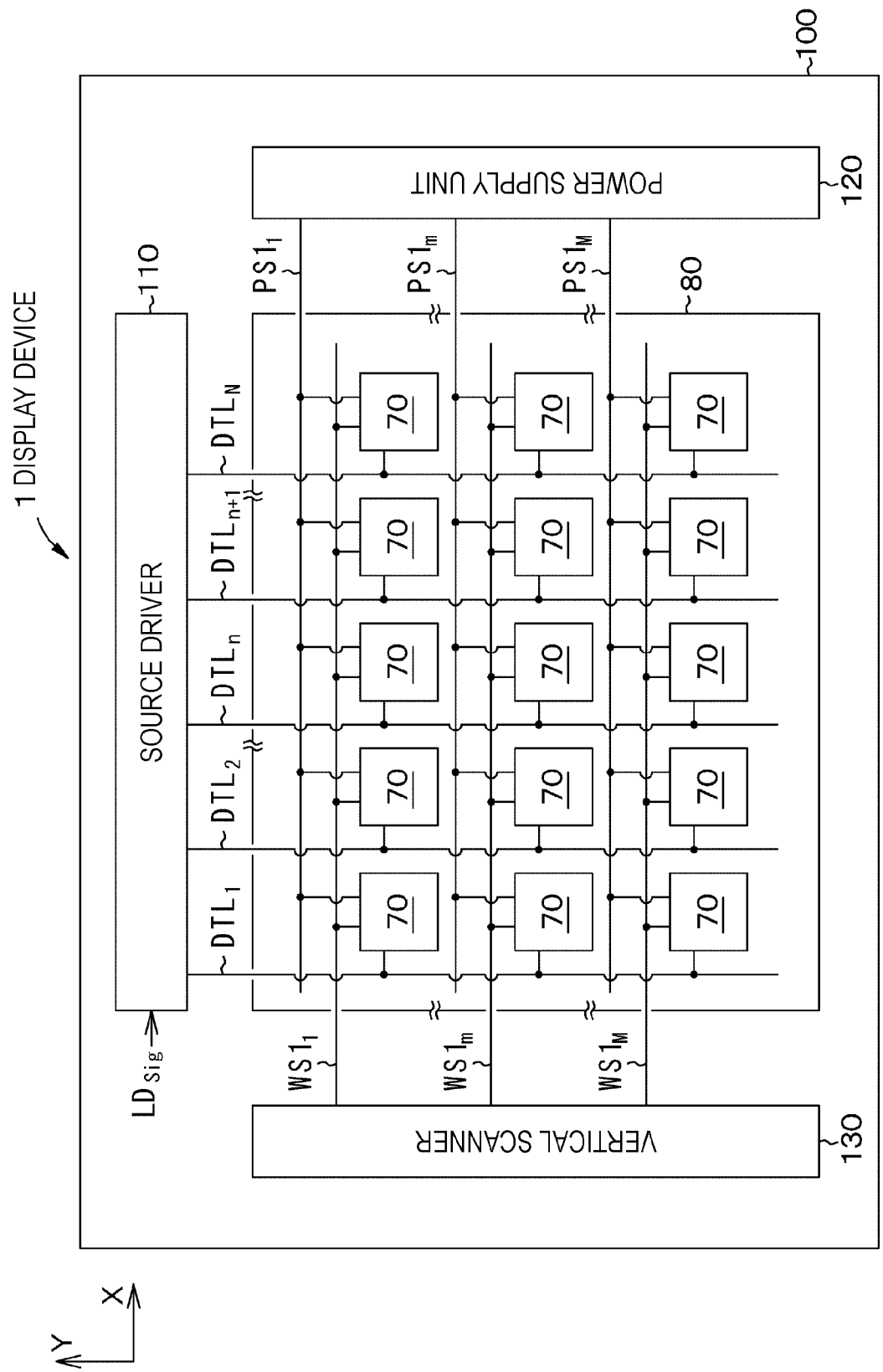
FIG. 1 is a conceptual diagram of a display device according to a first embodiment.

Hereinafter, the present disclosure will be described on the basis of embodiments with reference to the drawings. The present disclosure is not limited to the embodiments, and various numerical values and materials in the embodiments are examples. In the following description, the same reference signs will be used for the same elements or elements having the same function, and redundant description will be omitted. Note that, description will be given in the following order.

1. General description related to display element, display device, and electronic device according to present disclosure
2. First embodiment
3. Second embodiment
4. Third embodiment
5. Description of electronic device and others

[General Description Related to Display Element, Display Device, and Electronic Device According to Present Disclosure]

As described above, a display element according to a first aspect of the present disclosure, and a display element used for a display device according to the first aspect of the present disclosure and an electronic device according to the first aspect of the present disclosure (hereinafter, these may be simply referred to as "display elements of the present disclosure") each include a light-emitting unit of a current drive type, and a drive unit that drives the light-emitting unit, in which the drive unit includes a capacitance unit, a drive transistor that causes a current corresponding to a voltage held by the capacitance unit to flow through the light-emitting unit, and a write transistor that writes a signal voltage to the capacitance unit, the drive transistor and the write transistor are formed in a state of being separated by an element isolation region, on a semiconductor substrate, and a capacitance generated in a portion where the drive transistor and the write transistor face each other through the element isolation region functions as at least a part of the capacitance unit.

In the display element of the present disclosure, a configuration can be made in which the drive transistor and the write transistor are provided in a well formed in the semiconductor substrate, the drive transistor includes a first source/drain region to which a feeder line is connected and a second source/drain region connected to one end of the light-emitting unit, the write transistor includes a first source/drain region to which the signal voltage is supplied externally and a second source/drain region connected to a gate electrode of the drive transistor, and the second source/drain region of the write transistor and the first source/drain region of the drive transistor are formed to face each other through the element isolation region.

In the display element of the present disclosure including various preferable configurations described above, a configuration can be made in which the element isolation region is formed by a shallow trench isolation (STI) structure in which an insulator is embedded in a groove dug in a surface of the semiconductor substrate.

In this case, a configuration can be made in which an impurity diffusion layer that forms a source/drain region of the drive transistor and an impurity diffusion layer that forms a source/drain region of the write transistor are set to have a junction depth of greater than or equal to 1 micrometer.

In the display element of the present disclosure including various preferable configurations described above, a configuration can be made in which the drive transistor includes a p-channel field effect transistor. In this case, the write transistor may have an n-channel configuration or a p-channel configuration. From a viewpoint of standardization of manufacturing processes, the conductivity type of the write transistor is preferably a p-channel field effect transistor that is the same as that of the drive transistor.

In the display element of the present disclosure including various preferable configurations described above, a configuration can be made in which a shield wiring line is provided around a gate wiring line that connects the second source/drain region of the write transistor and the gate electrode of the drive transistor to each other. In this case, a configuration can be made in which the shield wiring line is connected to the feeder line.

In the display element of the present disclosure including various preferable configurations described above, a configuration can be made in which the drive unit further includes another transistor. A configuration can be made in which the drive unit further includes a switching transistor connected between the feeder line and the first source/drain region of the drive transistor, or alternatively, the drive unit further includes a switching transistor connected between the one end of the light-emitting unit and the second source/drain region of the drive transistor.

As the light-emitting unit of the current drive type constituting the display element of the present disclosure including the various preferable configurations described above, it is possible to use an organic electroluminescence element, an LED element, a semiconductor laser element, or the like. These elements can be configured using known materials and methods. From a viewpoint of configuring a flat type display device, it is preferable that a configuration is made in which the light-emitting unit includes an organic electroluminescence element among the elements.

Hereinafter, the display element, the display device, and the electronic device according to the present disclosure may be simply referred to as the present disclosure.

A source driver and the like that drive the display device may be integrated together on the semiconductor substrate on which the display elements are arranged, or may be appropriately configured as a separate body. These can be configured using known circuit elements. For example, a source driver, a power supply unit, and a vertical scanner illustrated in FIG. 1 can also be configured using known circuit elements. In applications where downsizing is required, such as a display device for a head mounted display or a viewfinder, it is preferable that the display elements and the driver are formed on the same semiconductor substrate.

The display device may have a so-called monochrome display configuration or a color display configuration. In the case of a color display configuration, a configuration can be made in which one pixel includes a plurality of subpixels, specifically, one pixel includes a set of a red display element, a green display element, and a blue display element. Moreover, a configuration can also be made in which one set includes additional one type or multiple types of display element together with these three types of display elements.

As values of the pixels of the display device, in addition to U-XGA (1600, 1200), HD-TV (1920, 1080), and Q-XGA (2048, 1536), some of the image display resolutions can be exemplified, such as (3840, 2160), and (7680, 4320); however, the values of the pixels of the display device are not limited to these values.

Various conditions described in the present specification are satisfied not only in a case where the conditions mathematically strictly holds but also in a case where the conditions substantially holds. Presence of various variations in design or manufacturing is allowed. Furthermore, each drawing used in the following description is schematic and does not indicate actual dimensions and ratios thereof. For example, FIG. 3 described later illustrates a cross-sectional structure of the display device, but does not indicate the ratio of width, height, thickness, and the like. Furthermore, the shape of the waveform in the timing chart illustrated in, for example, FIG. 10 is also schematic.

First Embodiment

A first embodiment relates to a display element, a display device, and an electronic device according to the first aspect of the present disclosure.

FIG. 1 is a conceptual diagram of the display device according to the first embodiment.

First, an outline will be described of the display device with reference to FIG. 1. A display device 1 includes display elements 70 arrayed in a two-dimensional matrix. More specifically, the display elements 70 are arrayed in a two-dimensional matrix having a total of N×M elements, N elements in the row direction and M elements in the column direction, in a state where each of the display elements 70 is connected to a scanning line WS1 and a feeder line (current supply line) PS1 extending in the row direction (X direction in FIG. 1), and a data line DTL extending in the column direction (Y direction in FIG. 1).

The display elements 70 arrayed in a two-dimensional matrix form a display area 80 that displays an image. The number of rows of the display elements 70 in the display area 80 is M, and the number of the display elements 70 constituting the rows is N.

The number of the scanning lines WS1 and the number of the feeder lines PS1 are each M. The display elements 70 in the m-th row (where m=1, 2, . . . , M) are connected to the m-th scanning line $WS1_m$ and the m-th feeder line $PS1_m$, and constitute one display element row.

Note that, the number of control lines DS1 illustrated in FIG. 15 and the number of control lines EM1 illustrated in FIG. 17, described later, each are also M, and the m-th control line DS1$_m$ and control line EM1$_m$ are connected to the display elements in the m-th row.

The number of the data lines DTL is N. The display elements 70 in the n-th column (where n=1, 2, . . . , N) are connected to the n-th data line DTL$_n$.

Note that, although not illustrated in FIG. 1, the display device 1 includes a common feeder line PS2 connected to all the display elements 70 in common. For example, a ground potential is regularly supplied as a common voltage to the common feeder line PS2.

The display device 1 includes a source driver 110 that drives the display area 80, a power supply unit 120, and a vertical scanner 130.

The display area 80 is formed on a semiconductor substrate including silicon. Note that, the source driver 110, the power supply unit 120, and the vertical scanner 130 are also formed on a semiconductor substrate 100. That is, the display device 1 is a driver circuit integrated display device.

A signal LD$_{Sig}$ representing a gradation corresponding to an image to be displayed is input to the source driver 110 from a device not illustrated, for example. The signal LD$_{Sig}$ is, for example, a low voltage digital signal. The source driver 110 is used to generate an analog signal corresponding to a gradation value of the video signal LD$_{Sig}$ and supply the analog signal to the data line DTL as a video signal. The analog signal to be generated is a signal having a peak value of about 10 volts, for example.

The vertical scanner 130 supplies a scanning signal to the scanning line WS1. In accordance with the scanning signal, line-sequential scanning is performed on the display elements 70 for each row. Corresponding to scanning of the scanning line WS1, the power supply unit 120 supplies a predetermined drive voltage to the feeder line PS1.

The display device 1 is, for example, a color display device, and a group of three display elements 70 arranged in the row direction constitutes one pixel. Thus, if N'=N/3, a total of N'×M pixels, N' pixels in the row direction and M pixels in the column direction, are arrayed in the display area 80.

As described above, line-sequential scanning is performed on the display elements 70 for each row by the scanning signal of the vertical scanner 130. The display element 70 located in the m-th row and the n-th column is hereinafter referred to as the (n, m)-th display element 70.

In the display device 1, N display elements 70 arrayed in the m-th row are driven simultaneously. In other words, in the N display elements 70 arranged along the row direction, timing of light emission/non-light emission is controlled for each row to which the N display elements 70 belong. If a display frame rate of the display device 1 is represented as FR (times/second), the scanning period per row (so-called horizontal scanning period) when the line-sequential scanning is performed on the display device 1 for each row is less than (1/FR)×(1/M) seconds.

An outline of the display device 1 has been described above. Next, details of the display elements 70 will be described.

Figure 2:
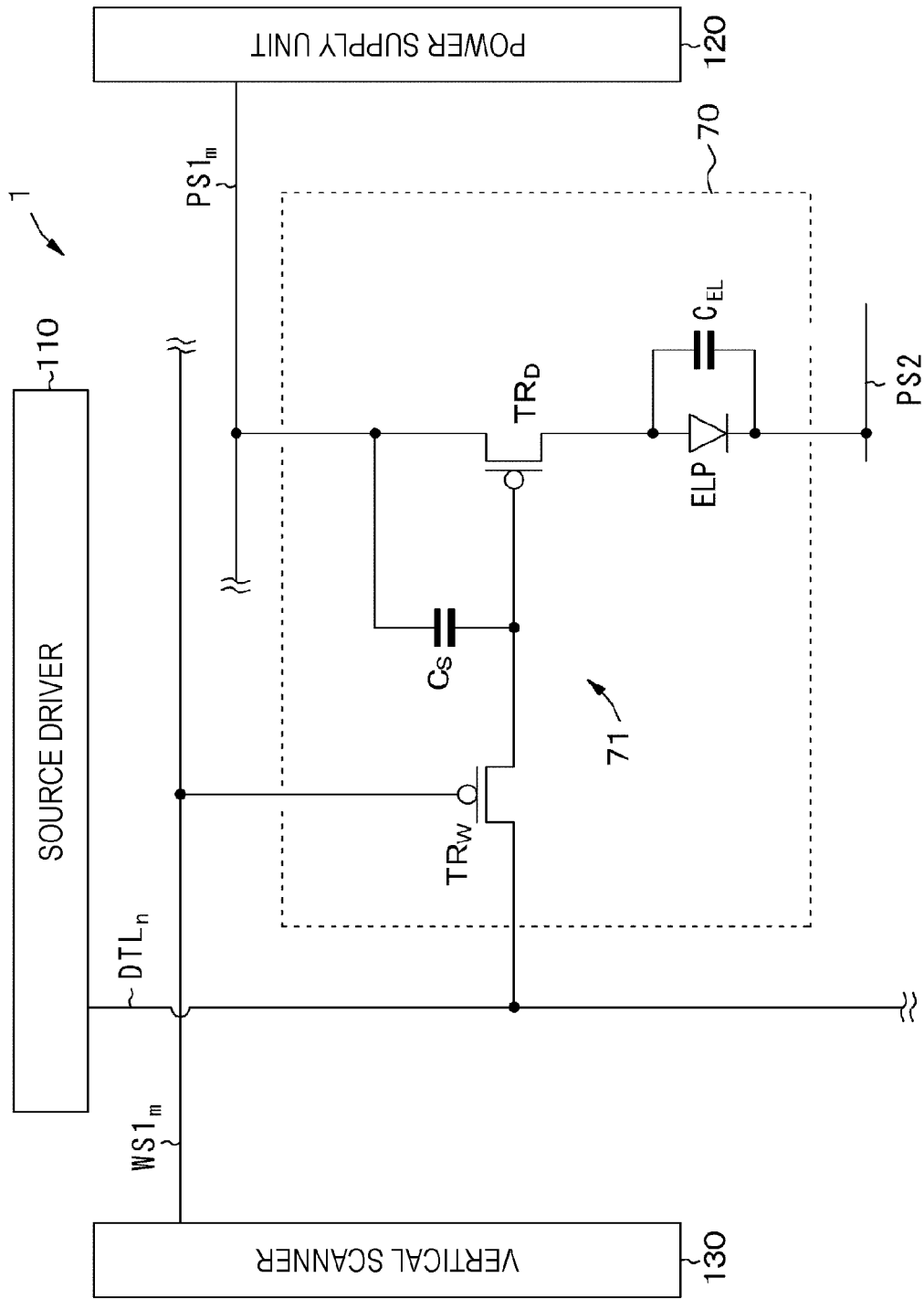
FIG. 2 is an equivalent circuit diagram of a display element including a light-emitting unit and a drive unit that drives the light-emitting unit.

FIG. 2 is an equivalent circuit diagram of the display element including the light-emitting unit and the drive unit that drives the light-emitting unit. Note that, for convenience of illustration, FIG. 2 illustrates a connection relationship for one display element 70, more specifically, the (n, m)-th display element 70.

The display element 70 includes a light-emitting unit ELP of the current drive type and a drive unit 71 that drives the light-emitting unit ELP. The drive unit 71 includes a capacitance unit C$_S$, a drive transistor TR$_D$ that causes a current corresponding to a voltage held by the capacitance unit C$_S$ to flow through the light-emitting unit ELP, and a write transistor TR$_W$ that writes a signal voltage to the capacitance unit C$_S$.

The light-emitting unit ELP is a light-emitting unit of the current drive type whose light emission luminance changes depending on a value of a current flowing, and specifically, includes an organic electroluminescence element. The light-emitting unit ELP has known configuration and structure including an anode electrode, a hole transporting layer, a light emitting layer, an electron transporting layer, a cathode electrode, and the like.

The drive transistor TR$_D$ includes a p-channel transistor. Furthermore, the write transistor TR$_W$ also includes a p-channel field effect transistor. Note that, the write transistor TR$_W$ may be an n-channel field effect transistor.

The capacitance unit C$_S$ is used to hold a voltage of the gate electrode with respect to the source region of the drive transistor TR$_D$ (so-called gate-source voltage). During light emission of the display element 70, a first source/drain region (the side connected to the feeder line PS1 in FIG. 2) of the drive transistor TR$_D$ serves as the source region, and a second source/drain region serves as the drain region. A first electrode and a second electrode constituting the capacitance unit C$_S$ are connected to the first source/drain region and the gate electrode of the drive transistor TR$_D$, respectively. The second source/drain region of the drive transistor TR$_D$ is connected to the anode electrode of the light-emitting unit ELP.

The write transistor TR$_W$ has the gate electrode connected to the scanning line WS1, a first source/drain region connected to the data line DTL, and a second source/drain region connected to the gate electrode of the drive transistor TR$_D$.

The other end (specifically, the cathode electrode) of the light-emitting unit ELP is connected to the common feeder line PS2. A predetermined voltage V$_{Cath}$ is supplied to the common feeder line PS2. Note that, a capacitance of the light-emitting unit ELP is represented by a reference sign C$_{EL}$. In a case where the capacitance C$_{EL}$ of the light-emitting unit ELP is small so that a trouble occurs in driving the display element 70, for example, it is only required to provide an auxiliary capacitance connected in parallel to the light-emitting unit ELP as necessary.

When the write transistor TR$_W$ is made to be in the conductive state by the scanning signal from the vertical scanner 130 in a state where the voltage corresponding to the luminance of the image to be displayed on the data line DTL is supplied from the source driver 110, a voltage corresponding to a gradation value of the image to be displayed is written to the capacitance unit C$_S$. Then, the write transistor TR$_W$ is made to be in the non-conductive state, a current flows through the drive transistor TR$_D$ depending on the voltage held in the capacitance unit C$_S$, and the light-emitting unit ELP emits light.

Here, the drive transistor TR$_D$ is driven so that a drain current I$_{ds}$ flows in accordance with the following formula (1) in the light emitting state of the light-emitting unit ELP. In the light emitting state of the light-emitting unit ELP, the first source/drain region of the drive transistor TR$_D$ serves as the source region, and the second source/drain region serves as the drain region. Note that, parameters represent μ: Effective mobility L: Channel length W: Channel width $V_{CC}$: Drive voltage supplied to source region
$V_{Sig}$: Signal voltage applied to gate electrode
$V_{th}$: Threshold voltage
$C_{ox}$: (Relative dielectric constant of gate insulating layer)×(dielectric constant of vacuum)/(thickness of gate insulating layer)

$$k \equiv (1/2) \cdot (W/L) \cdot C_{ox}$$

$$I_{ds} = k \cdot \mu \cdot ((V_{CC} - V_{Sig}) - |V_{th}|)^2 \quad (1)$$

Figure 3:
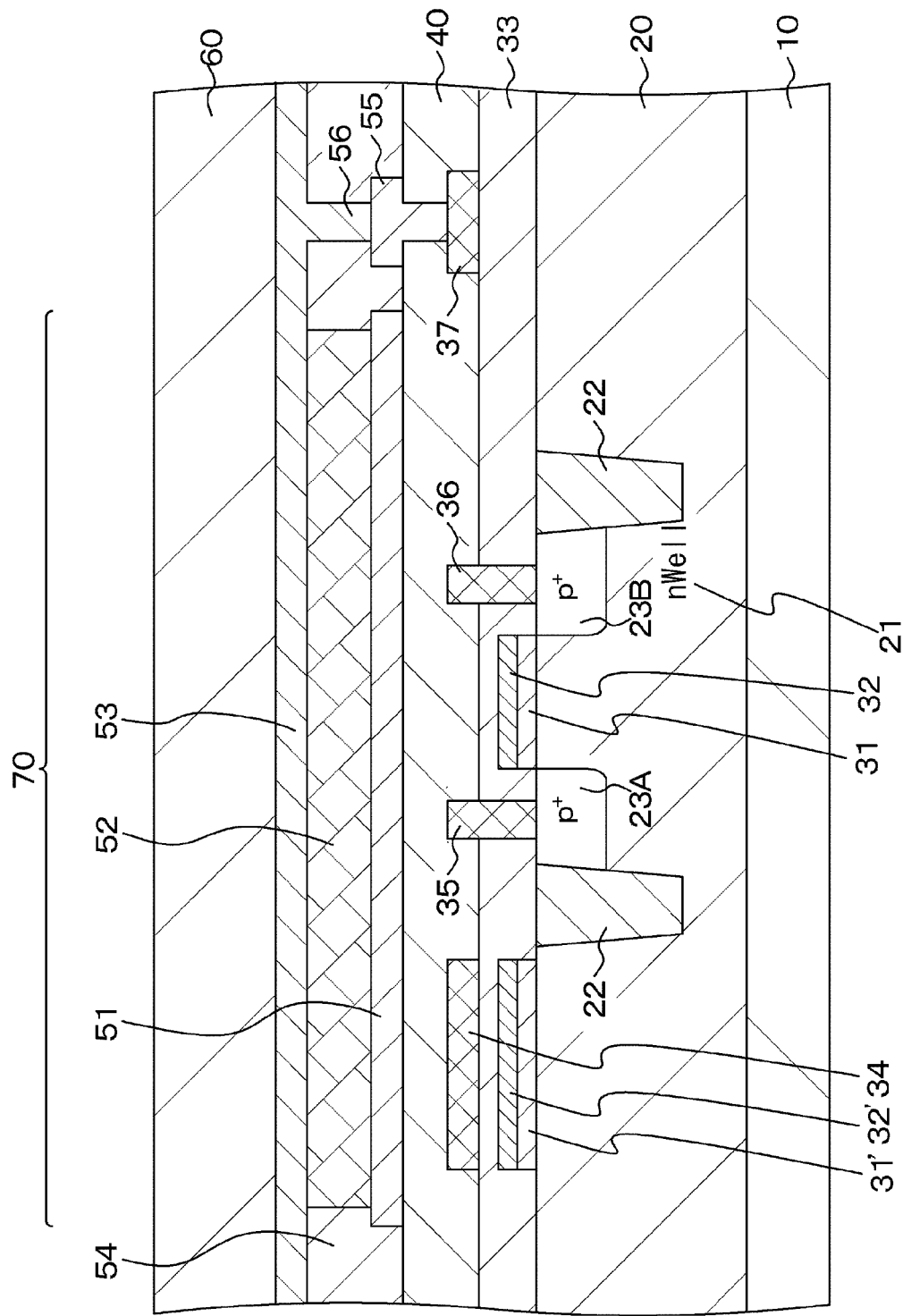
FIG. 3 is a schematic partial cross-sectional view of a portion including the display element in a display area.

Here, a three-dimensional arrangement relationship will be described among the light-emitting unit ELP, the transistor, and the like. FIG. 3 is a schematic partial cross-sectional view of a portion including the display element in the display area.

Each transistor constituting the display element 70 is formed, for example, on a semiconductor substrate (reference numeral 100 illustrated in FIG. 1) in which a semiconductor layer 20 including silicon is formed on a base material 10. More specifically, the drive transistor $TR_D$ and the write transistor $TR_W$ are provided in an n well 21 formed in the semiconductor layer 20. Note that, for convenience of illustration, only the drive transistor $TR_D$ is illustrated in FIG. 3. Reference numerals 23A and 23B denote a pair of source/drain regions of the drive transistor $TR_D$.

Each transistor is surrounded by an element isolation region 22. A reference numeral 32 denotes the gate electrode of the transistor $TR_D$, and a reference numeral 31 denotes the gate insulating layer. As will be described later with reference to FIG. 4, the drive transistor $TR_D$ and the write transistor $TR_W$ are formed on the semiconductor substrate in a state of being separated by the element isolation region 22. Note that, for convenience of illustration, in FIGS. 4, 5, 6, 7, 12, 13, 14, 16, and 18 described later, the gate electrode is represented by reference numeral 31 regardless of the type of the transistor.

A second electrode 32' constituting the capacitance unit $C_S$ includes the same material layer as the gate electrode 32, and is formed on an insulating layer 31' including the same material layer as the gate insulating layer 31. An interlayer insulating layer 33 is formed on the entire surface of the semiconductor layer 20 including the gate electrode 32 of the drive transistor $TR_D$ and the electrode 32'. The electrode 32' and an electrode 34 described later are arranged to face each other across the interlayer insulating layer 33.

The first source/drain region 23A of the drive transistor $TR_D$ is connected to the feeder line PS1 and the electrode 34 through a contact hole 35 provided in the interlayer insulating layer 33. Note that, the connection portion is hidden and not visible in FIG. 3. On the interlayer insulating layer 33, an interlayer insulating layer 40 is further formed.

On the interlayer insulating layer 40, the light-emitting unit ELP is provided including an anode electrode 51, a hole transporting layer, a light emitting layer, an electron transporting layer, and a cathode electrode 53. Note that, in the drawing, the hole transporting layer, the light emitting layer, and the electron transporting layer are represented by a single layer 52. A second interlayer insulating layer 54 is provided on a portion of the interlayer insulating layer 40 where the light-emitting unit ELP is not provided, a transparent substrate 60 is arranged on the second interlayer insulating layer 54 and the cathode electrode 53, and light emitted from the light emitting layer passes through the substrate 60 and is emitted to the outside.

The anode electrode 51 and the second source/drain region 23B of the drive transistor $TR_D$ are connected through a contact hole 36 provided in the interlayer insulating layer 33, and the like. Note that, in FIG. 3, the connection portion is hidden and not visible.

Furthermore, the cathode electrode 53 is connected to a wiring line 37 (corresponding to the common feeder line PS2 to which the voltage $V_{Cath}$ is supplied) provided on an extending portion of the interlayer insulating layer 33 through contact holes 56 and 55 provided in the second interlayer insulating layer 54 and the interlayer insulating layer 40.

The three-dimensional arrangement relationship has been described above among the light-emitting unit ELP, the transistor, and the like. Next, an arrangement will be described of the transistors in the drive unit according to the first embodiment.

Figure 4:
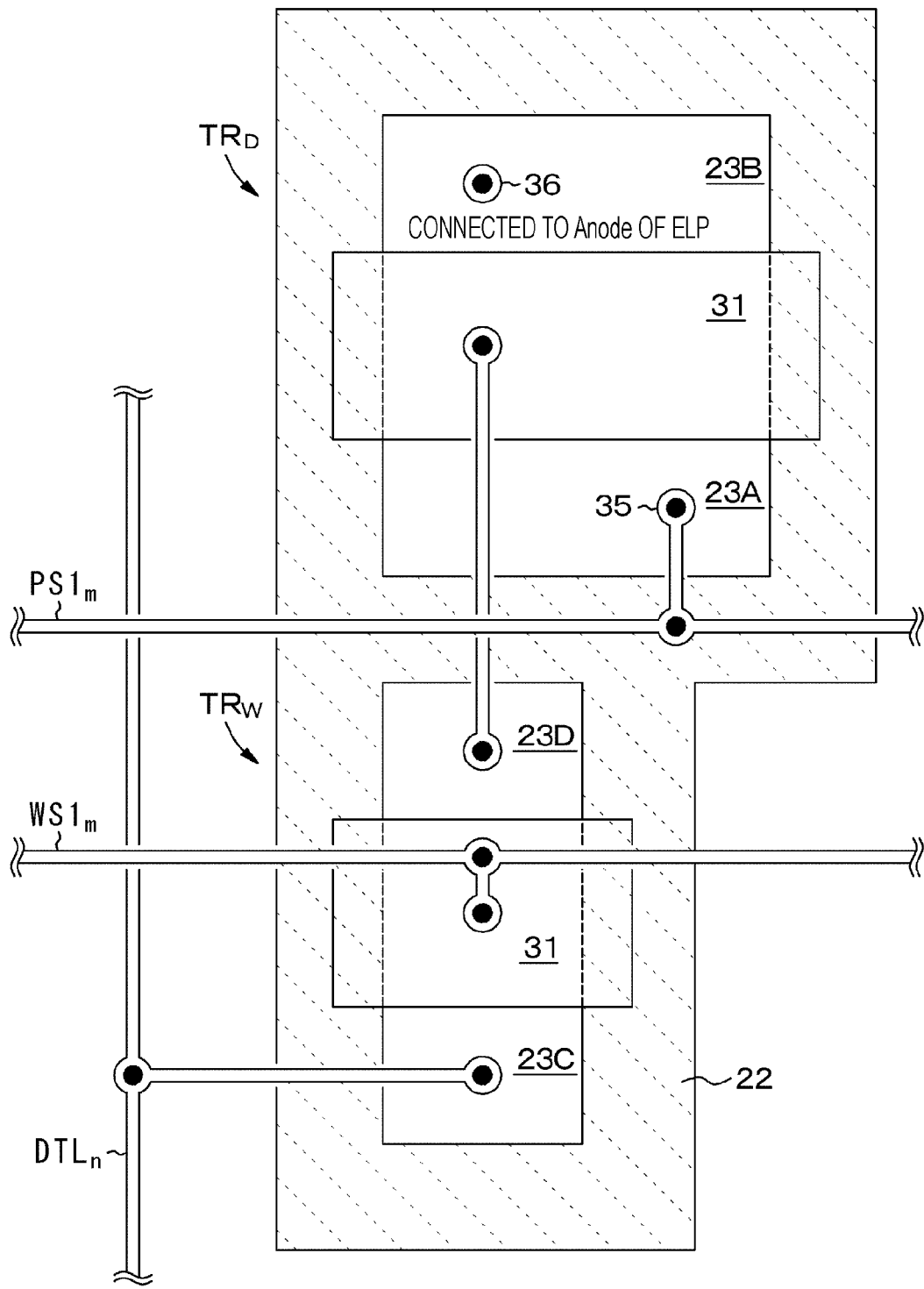
FIG. 4 is a schematic plan view for explaining an arrangement of transistors in a drive unit according to the first embodiment.
Figure 5:
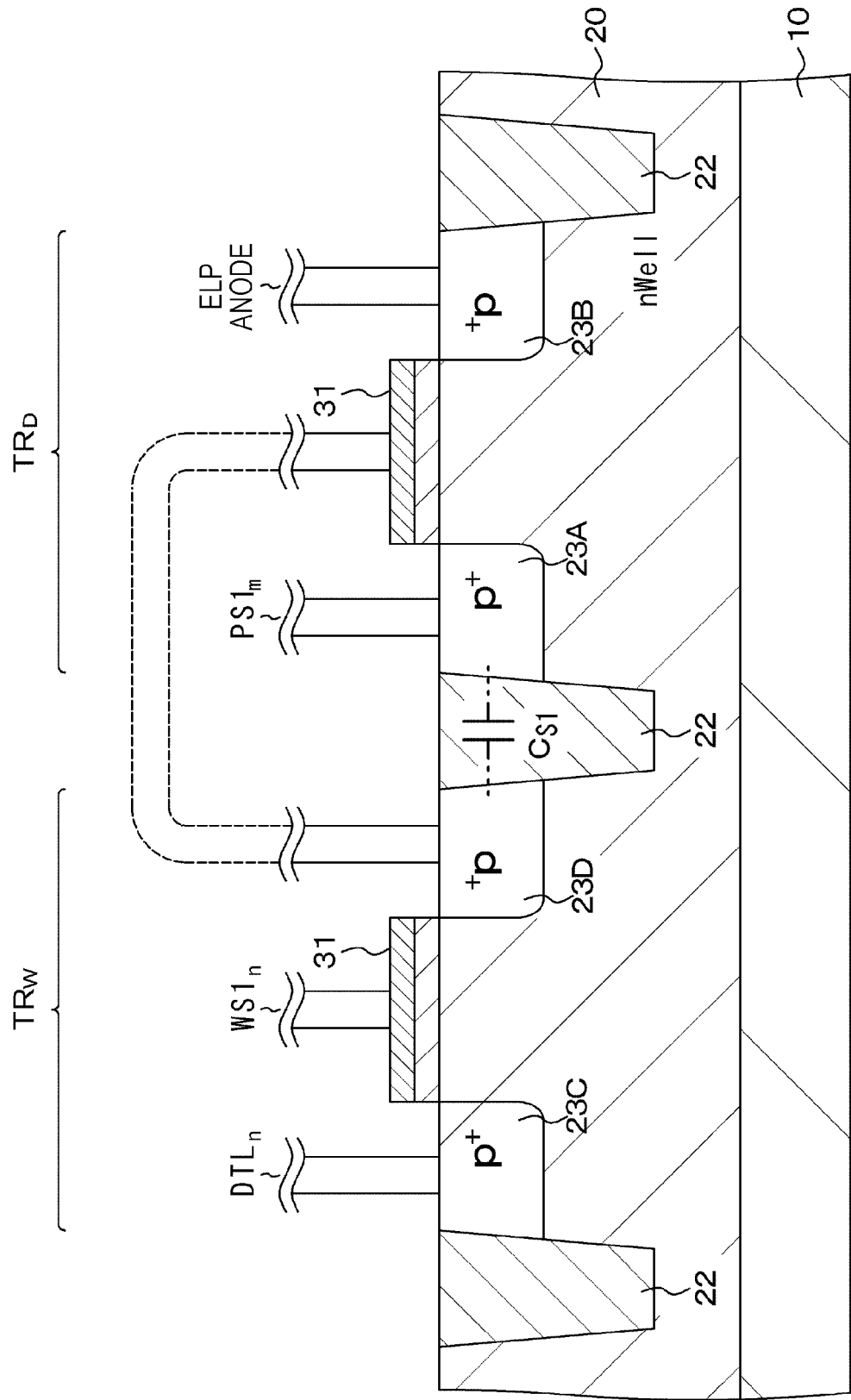
FIG. 5 is a schematic cross-sectional view for explaining a cross-sectional structure of the transistors in the drive unit according to the first embodiment.

FIG. 4 is a schematic plan view for explaining the arrangement of the transistors in the drive unit according to the first embodiment. FIG. 5 is a schematic cross-sectional view for explaining a cross-sectional structure of the transistors in the drive unit according to the first embodiment.

As illustrated in FIGS. 4 and 5, the drive transistor $TR_D$ and the write transistor $TR_W$ are formed on the semiconductor substrate in a state of being separated by the element isolation region 22. Then, a second source/drain region 23D of the write transistor $TR_W$ and the first source/drain region 23A of the drive transistor $TR_D$ are formed to face each other through the element isolation region 22. The element isolation region 22 is formed by the shallow trench isolation (STI) structure in which the insulator is embedded in the groove dug in the surface of the semiconductor substrate.

As described above, the drive transistor $TR_D$ includes the first source/drain region 23A to which the feeder line PS1 is connected and the second source/drain region 23B connected to one end of the light-emitting unit ELP. Furthermore, the write transistor $TR_W$ includes a first source/drain region 23C to which the signal voltage is supplied from the outside, and the second source/drain region 23D connected to the gate electrode of the drive transistor $TR_D$.

As the pixel pitch becomes finer, the inter-terminal distance is reduced between the second source/drain region 23D of the write transistor $TR_W$ and the second source/drain region 23A of the drive transistor $TR_D$. As a result, a capacitance (parasitic capacitance) (represented by a reference sign $C_{S1}$) through the embedded insulator used as the element isolation region 22 increases.

However, in the drive unit 71 of the present disclosure, the capacitance generated in a portion where the drive transistor $TR_D$ and the write transistor $TR_W$ face each other through the element isolation region 22 functions as at least a part of the capacitance unit. As will be described in detail later with reference to FIG. 11, in this configuration, the capacitance generated between the transistors does not emphasize the burn-in phenomenon of the display image.

Next, to help understanding of the present disclosure, an arrangement of the transistors and problems will be described in a drive unit of a reference example in which the burn-in phenomenon is emphasized by the capacitance generated between the transistors.

Figure 6:
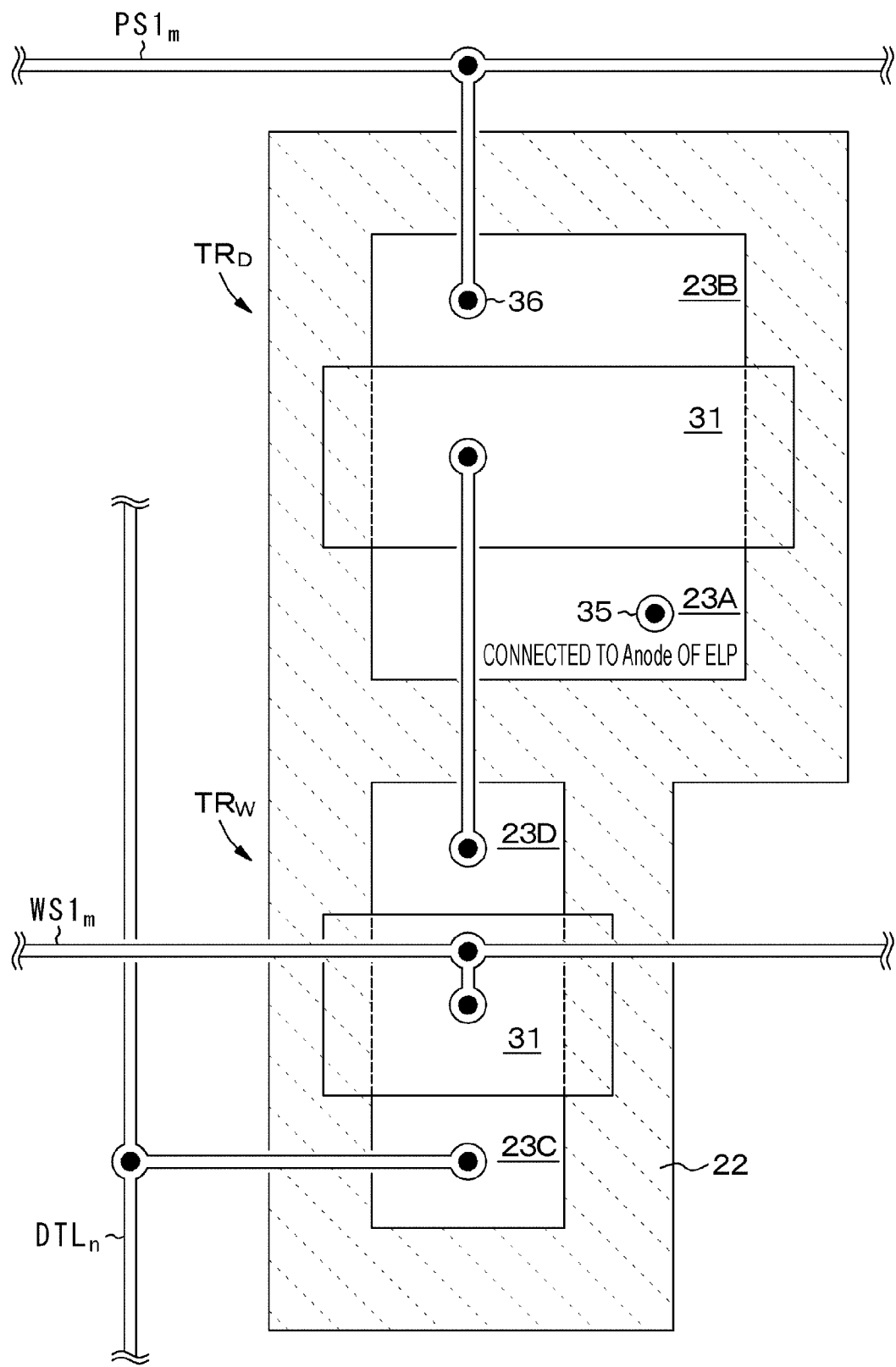
FIG. 6 is a schematic plan view for explaining an arrangement of the transistors in a drive unit of a reference example.
Figure 7:
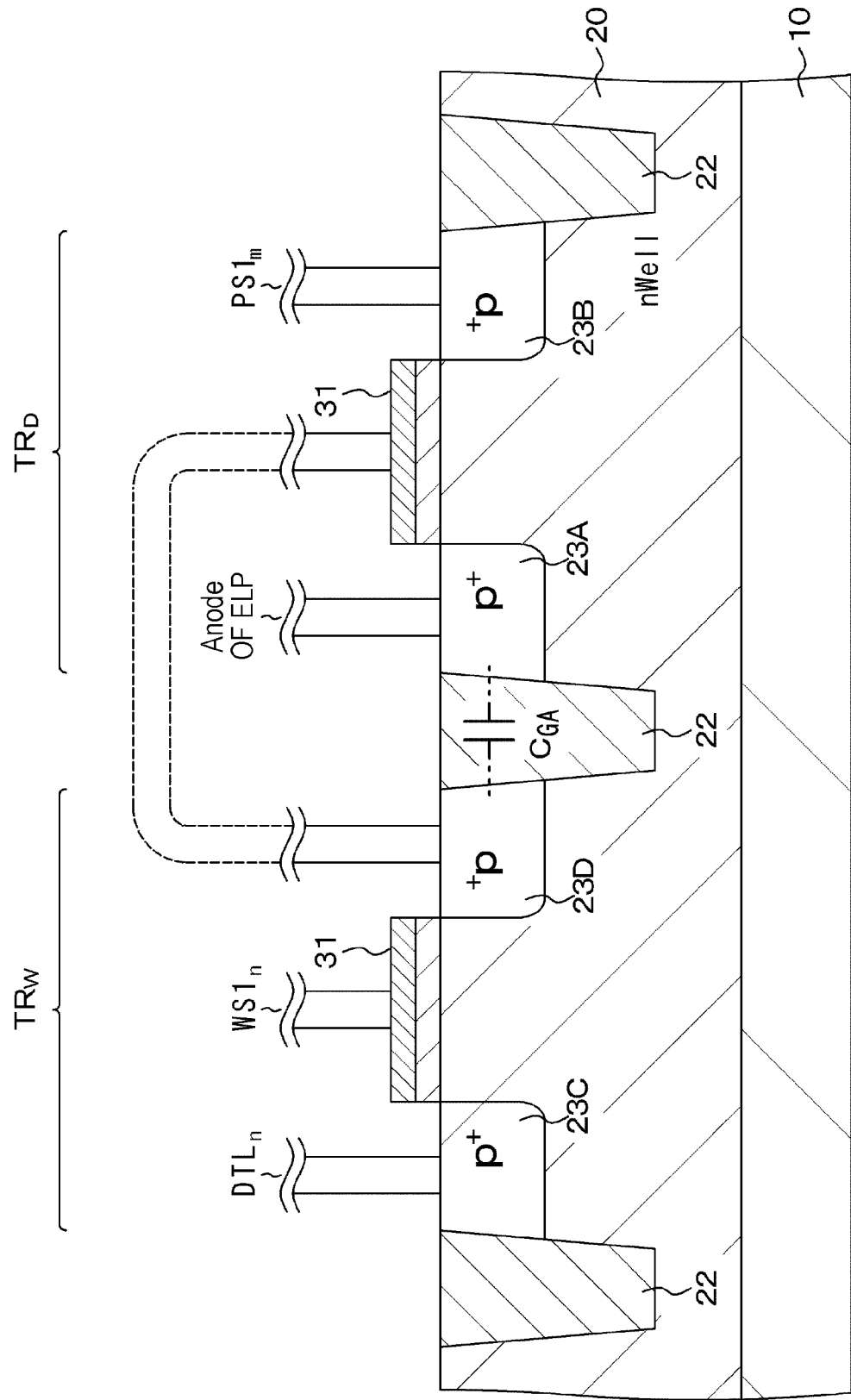
FIG. 7 is a schematic cross-sectional view for explaining a cross-sectional structure of the transistors in the drive unit of the reference example.

FIG. 6 is a schematic plan view for explaining the arrangement of the transistors in the drive unit of the reference example. FIG. 7 is a schematic cross-sectional view for explaining a cross-sectional structure of the transistors in the drive unit of the reference example.

As is clear by comparing FIGS. 4 and 6, in the drive unit of the reference example (represented by a reference numeral 971 in FIG. 8 described later), a connection relationship between the pair of source/drain regions 23A and 23B of the drive transistor $TR_D$, and the feeder line PS1 and the light-emitting unit ELP is opposite to that of the drive unit 71 of the first embodiment.

Also in this connection, a capacitance is generated in the portion where the drive transistor $TR_D$ and the write transistor $TR_W$ face each other through the element isolation region 22. The capacitance is represented by a sign $C_{GA}$.

FIG. 8 is a conceptual diagram of a display device including a display element including the drive unit of the reference example. Note that, for convenience of illustration, FIG. 8 illustrates a connection relationship for one display element 970 in a display device 9, more specifically, the (n, m)-th display element 970.

As illustrated in FIG. 8, in the display element 970 including the drive unit 971 of the reference example, the capacitance $C_{GA}$ functions as a capacitance connected between the gate electrode of the drive transistor $TR_D$ and the anode electrode of the light-emitting unit ELP. As will be described below, in this case, the luminance change due to a change with time of the voltage-current characteristic (V-I) characteristic of the light-emitting unit ELP is further emphasized.

Figure 9B:
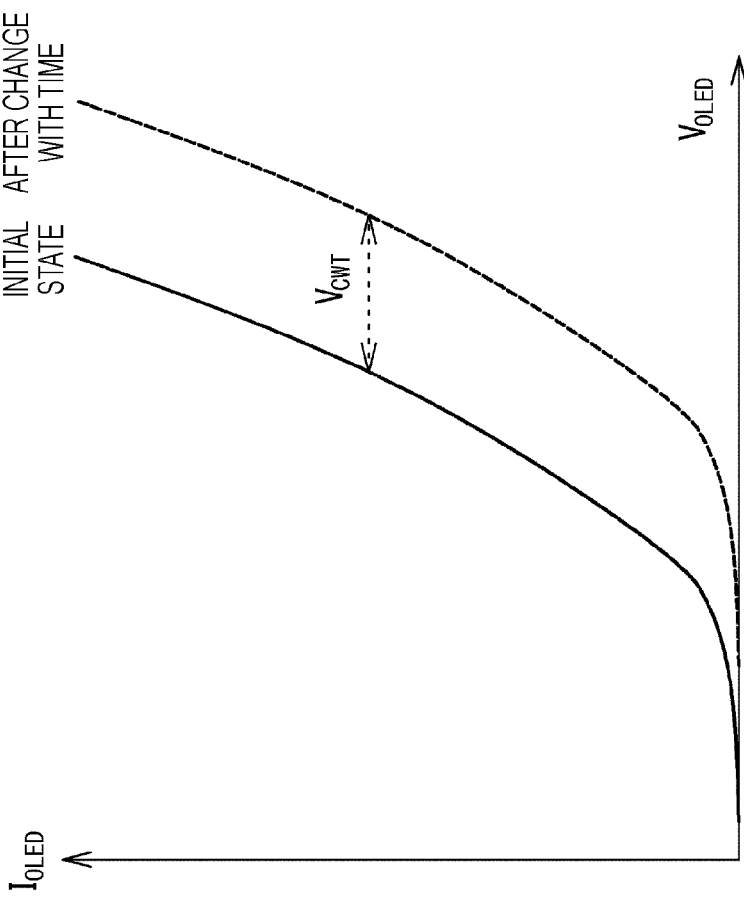
FIG. 9B is a schematic graph for explaining a change with time of the voltage-current characteristic (V-I) characteristic of the light-emitting unit.
Figure 9A:
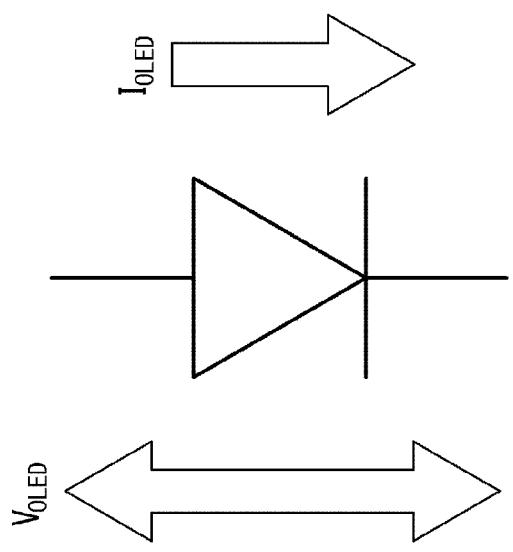
FIG. 9A is a schematic diagram for explaining a relationship between a current flowing through a light-emitting unit including an organic electroluminescence element and a voltage between the anode electrode and the cathode electrode of the light-emitting unit.

FIG. 9A is a schematic diagram for explaining a relationship between a current flowing through a light-emitting unit including an organic electroluminescence element and a voltage between the anode electrode and the cathode electrode of the light-emitting unit. FIG. 9B is a schematic graph for explaining the change with time of the voltage-current characteristic (V-I) characteristic of the light-emitting unit.

In general, the luminance of the light-emitting unit ELP including an organic electroluminescence element is proportional to a current flowing. Thus, basically, if a current $I_{OLED}$ flowing through the light-emitting unit ELP has the same value, the luminance of the light-emitting unit ELP also has the same value. On the other hand, a voltage $V_{OLED}$ between the terminals (between the anode electrode and the cathode electrode) of the light-emitting unit ELP tends to gradually increase due to the change with time. Thus, as illustrated in FIG. 9B, the voltage-current characteristic (V-I) characteristic of the light-emitting unit ELP changes from the initial state due to the change with time.

As described above, if the current $I_{OLED}$ flowing through the light-emitting unit ELP has the same value, the luminance of the light-emitting unit ELP basically has the same value. However, the voltage $V_{OLED}$ between the terminals of the light-emitting unit ELP gradually increases due to the change with time. Thus, if the voltage between the terminals of the light-emitting unit ELP in the initial state corresponding to the current $I_{OLED}$ is expressed as $V_{OLED\_INI}$, a voltage between the terminals of the light-emitting unit ELP after the change with time can be represented as $V_{OLED\_INI}+V_{CWT}$.

In the drive unit 971 of the reference example, the gate voltage of the drive transistor $TR_D$ changes due to influence of the above-described voltage $V_{CWT}$ due to the change with time, and the burn-in phenomenon is emphasized. Hereinafter, description will be given with reference to FIG. 10.

Figure 10A:
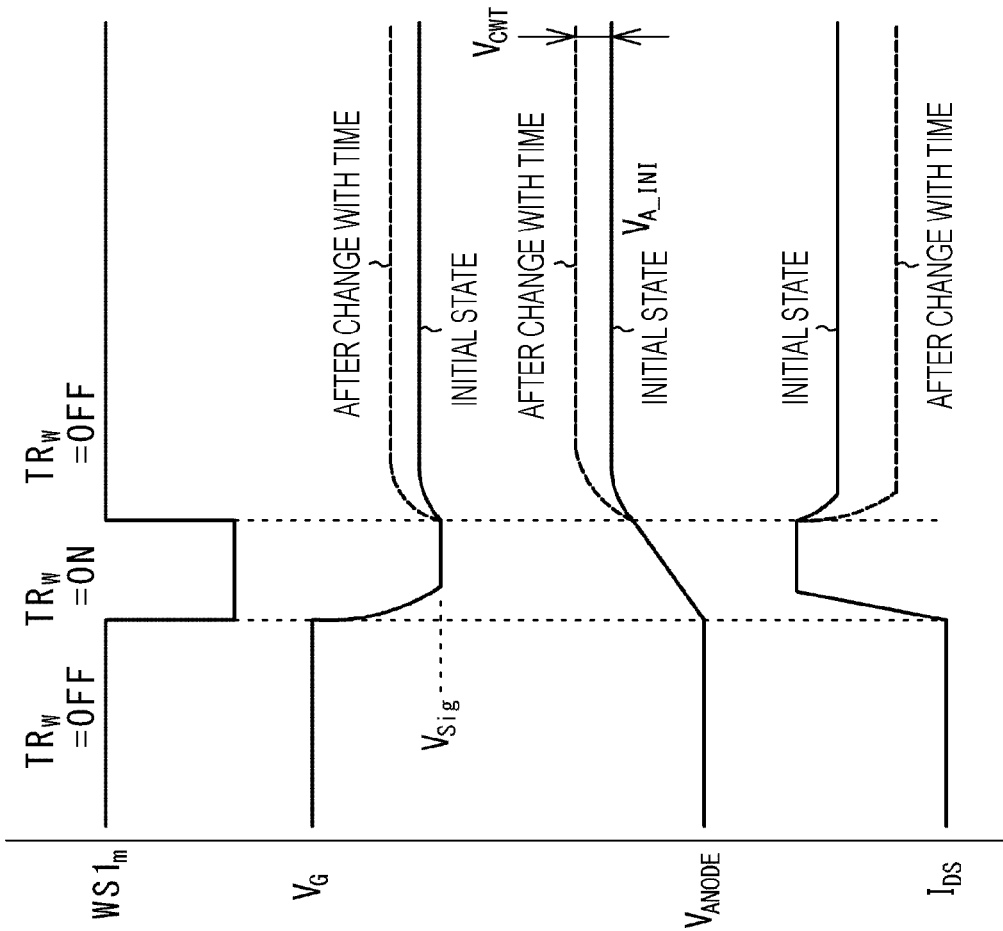
FIG. 10A is a schematic circuit diagram for explaining a drain current that flows during light emission of the display element including the drive unit of the reference example.
Figure 10B:
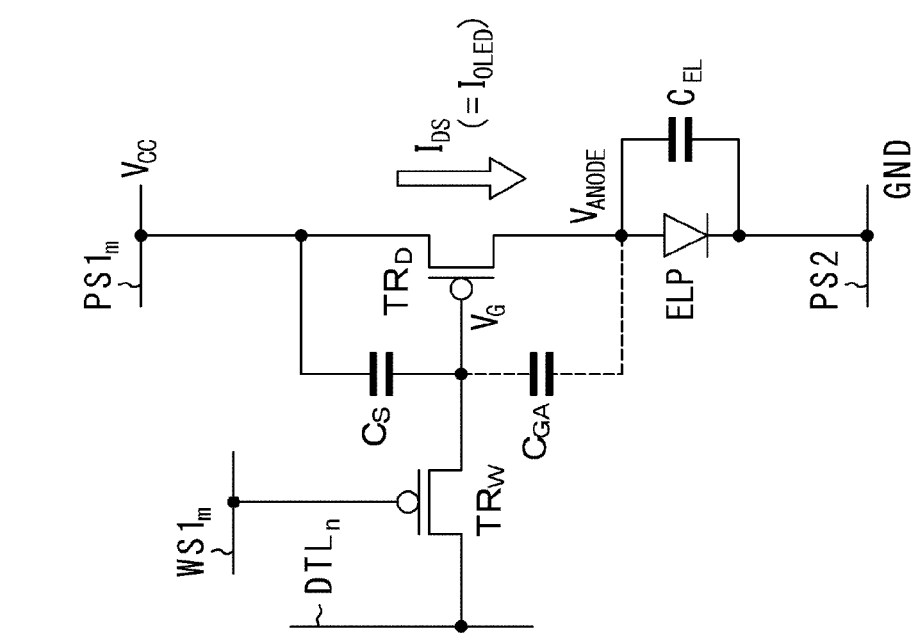
FIG. 10B is a schematic graph for explaining operation of the display element including the drive unit of the reference example.

FIG. 10A is a schematic circuit diagram for explaining a drain current that flows during light emission of the display element including the drive unit of the reference example. FIG. 10B is a schematic graph for explaining operation of the display element including the drive unit of the reference example.

As illustrated in FIG. 10B, the write transistor $TR_W$ enters the conductive state for a predetermined period by the scanning signal supplied to the scanning line WS1, and then enters the non-conductive state.

When the write transistor $TR_W$ is in the conductive state, the signal voltage $V_{Sig}$ is written to the gate electrode of the drive transistor $TR_D$ through the data line DTL. The gate-source voltage of the drive transistor $TR_D$ during writing is $(V_{CC}-V_{Sig})$. After the writing is completed, the write transistor $TR_W$ enters the non-conductive state. As a result, the gate electrode of the drive transistor $TR_D$ enters the floating state.

By writing the signal voltage, the drain current $I_{ds}$ flows through the light-emitting unit ELP, and an anode voltage $V_{ANODE}$ of the light-emitting unit ELP also rises accordingly. If the amount of rise in the voltage $V_{ANODE}$ when the light-emitting unit ELP is in the initial state is represented by a sign $V_{A\_INI}$, the amount of rise when the light-emitting unit ELP after the change with time can be represented as $(V_{A\_INI}+V_{CWT})$.

As described above, after the writing is completed, the gate electrode of the drive transistor $TR_D$ enters the floating state. For this reason, the change of the anode voltage reaches the gate electrode of the drive transistor $TR_D$ due to capacitive coupling by the capacitance $C_{GA}$.

When the light-emitting unit ELP is in the initial state, the amount of change of the gate electrode of the drive transistor $TR_D$ is represented as $$V_{A\_INI} \cdot C_{GA}/(C_S+C_{GA})$$

Furthermore, the drain current after the gate voltage change is represented as $$I_{ds}=k \cdot \mu \cdot ((V_{CC}-(V_{Sig}+V_{A\_INI} \cdot C_{GA}/(C_S+C_{GA}))-|Vth|)^2.$$

On the other hand, when the light-emitting unit ELP is of after the change with time, the amount of change of the gate electrode of the drive transistor $TR_D$ is represented as $$(V_{A\_INI}+V_{CWT}) \cdot C_{GA}/(C_S+C_{GA}).$$

Furthermore, the drain current after the gate voltage change is represented as $$I_{ds}=k \cdot \mu \cdot ((V_{CC}-(V_{Sig}+(V_{A\_INI}+V_{CWT}) \cdot C_{GA}/(C_S+C_{GA}))-|V_{th}|)^2$$

Thus, when the initial state is compared with the state after the change with time, a difference of $V_{CT} \cdot C_{GA}/(C_S+C_{GA})$ occurs in the amount of change in the gate voltage due to capacitive coupling. As a result, a difference also occurs in the drain current. Qualitatively, a change occurs such that the drain current decreases due to the change with time. As a result, the current flowing through the light-emitting unit ELP after the change with time is further reduced, which causes a problem that the burn-in phenomenon of the display image due to the change with time of the light-emitting unit ELP is emphasized.

Furthermore, this phenomenon becomes more remarkable as the capacitance $C_{GA}$ increases as the pixel pitch is reduced.

In the above, the arrangement of the transistors and the problems have been described in the drive unit 971 of the reference example.

In the drive unit 71 according to the first embodiment, the capacitance generated in the portion where the drive transistor $TR_D$ and the write transistor $TR_W$ face each other through the element isolation region 22 functions as at least a part of the capacitance unit. As a result, the change in the gate voltage due to capacitive coupling is less likely to occur.

Figure 11:
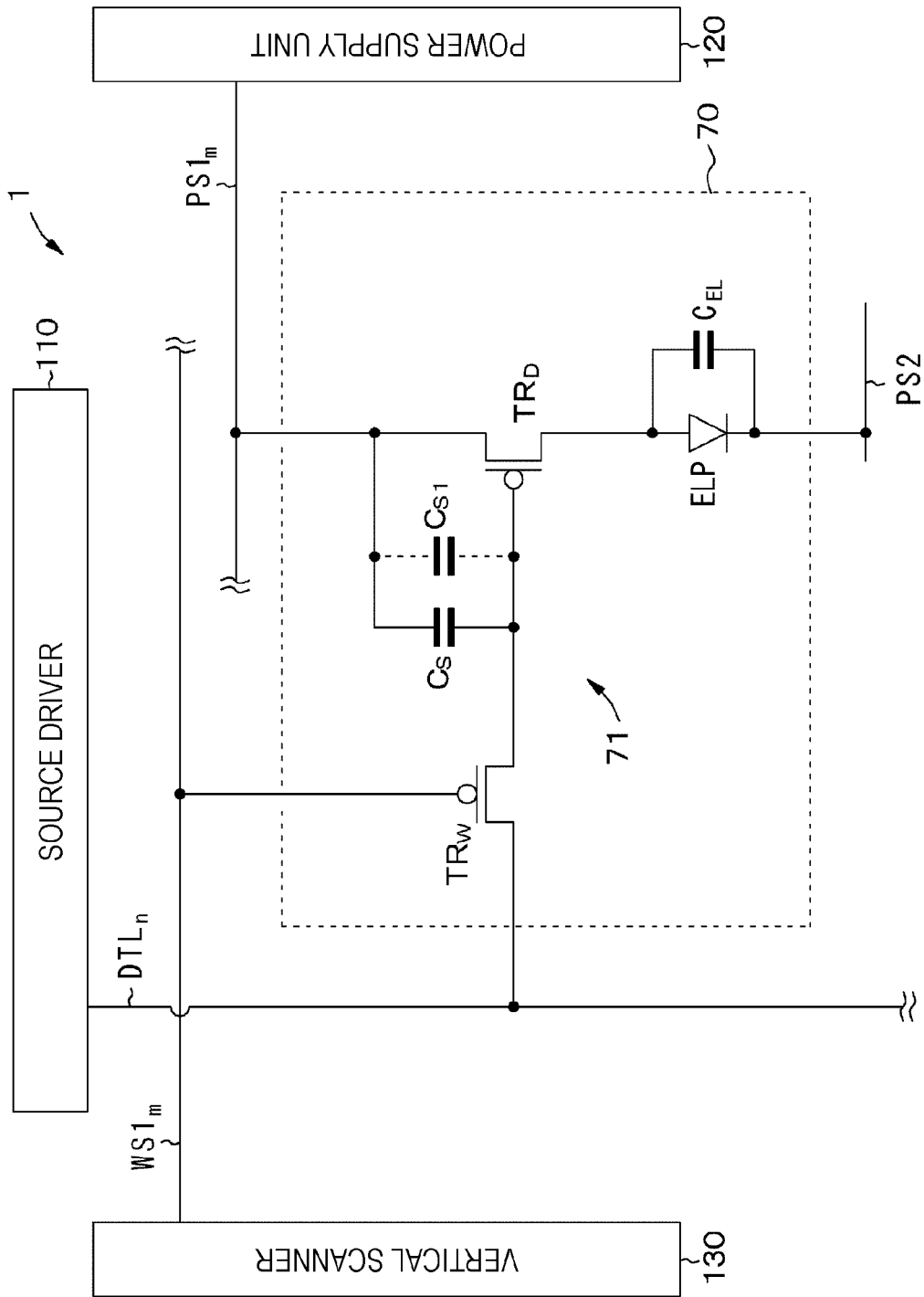
FIG. 11 is an equivalent circuit diagram of a display element in the first embodiment.

In the drive unit 71 having the transistor structure illustrated in FIGS. 4 and 5 described above, the capacitance $C_{S1}$ generated in the portion where the drive transistor $TR_D$ and the write transistor $TR_W$ face each other through the element isolation region 22 is connected between the first source/drain region 23A of the drive transistor $TR_D$ and the gate electrode of the drive transistor $TR_D$. Thus, an equivalent circuit diagram of the display element 70 in the first embodiment is expressed as illustrated in FIG. 11. As is clear from the connection relationship, the capacitance $C_{S1}$ functions as a part of the capacitance unit. Note that, in a case where the capacitance $C_{S1}$ has a sufficient capacitance for holding a video signal, the capacitance $C_S$ may be omitted.

In the first embodiment, even if the anode voltage $V_{ANODE}$ during light emission changes due to the change with time of the light-emitting unit ELP, the above-described problem due to the capacitive coupling does not occur. Thus, it is possible to avoid that the burn-in phenomenon due to the change with time of the voltage-current characteristic (V-I) characteristic of the light-emitting unit of the current drive type is emphasized by the influence of the capacitance.

Depending on the arrangement relationship of the transistors constituting the drive unit 71, a shield wiring line may be provided to prevent signal coupling that occurs between wiring lines. To help understanding, first, an arrangement will be described of a shield wiring line in the drive unit 971 of the reference example described above.

Figure 12:
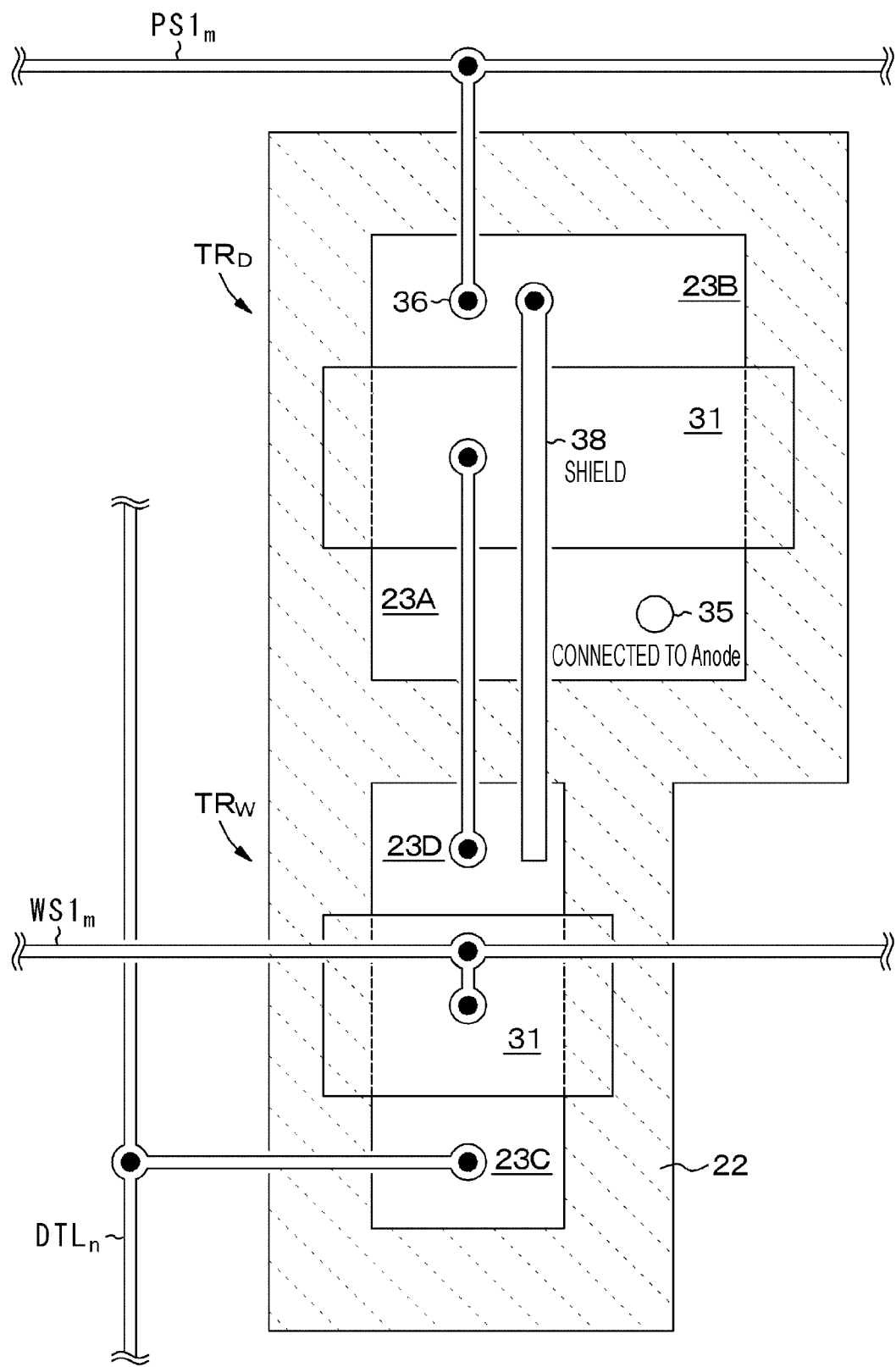
FIG. 12 is a schematic plan view for explaining a shield wiring line in the drive unit of the reference example.

FIG. 12 is a schematic plan view for explaining the shield wiring line in the drive unit of the reference example. The arrangement relationship of the transistors is similar to that in FIG. 6 described above.

In the arrangement of the transistors illustrated in FIG. 6, a wiring path connecting the second source/drain region 23D of the write transistor $TR_W$ and the gate electrode of the drive transistor $TR_D$ to each other intersects with a part to which the anode electrode of the light-emitting unit ELP is connected. Thus, to prevent the coupling, it has been necessary to insert a shield wiring line 38 separately as illustrated in FIG. 12.

In the first embodiment, the wiring path connecting the second source/drain region 23D of the write transistor $TR_W$ and the gate electrode of the drive transistor $TR_D$ to each other intersects with a part to which the feeder line PS1 is connected. Thus, basically, the coupling can be prevented to some extent even without the shield wiring line.

Figure 13:
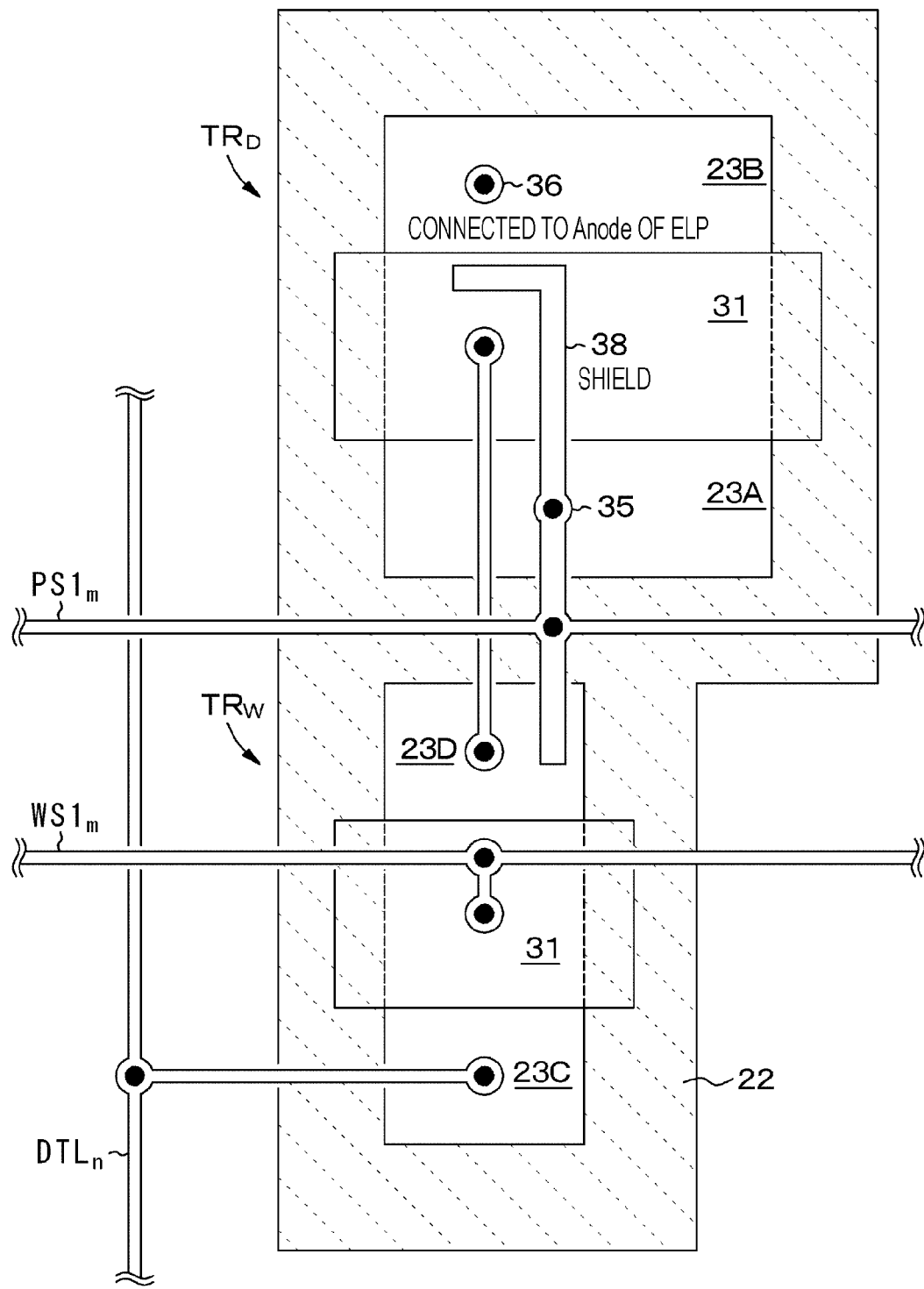
FIG. 13 is a schematic plan view for explaining a shield wiring line in the drive unit of the first embodiment.

Furthermore, in the case of more effectively preventing the coupling, as illustrated in FIG. 13, a configuration can also be made in which the shield wiring line 38 is provided around a gate wiring line for connecting the second source/drain region 23D of the write transistor $TR_W$ and the gate electrode of the drive transistor $TR_D$ to each other. By adopting a configuration in which the shield wiring line is connected to the feeder line PS1, wiring can be simplified. Note that, as illustrated in FIG. 13, the shield wiring line 38 is preferably routed to surround the gate wiring line not to generate a capacitance between the gate and the anode wiring lines.

Figure 14:
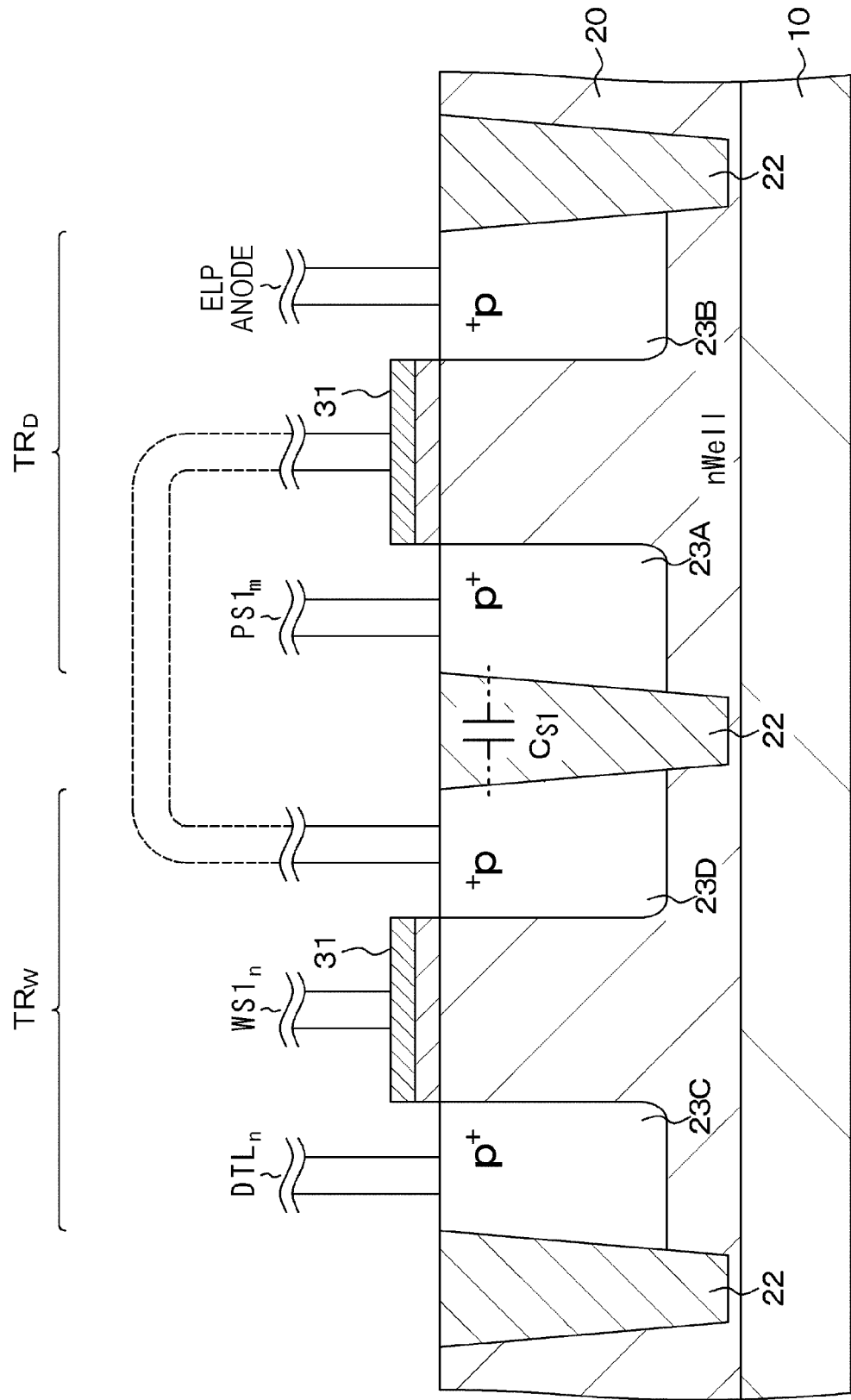
FIG. 14 is a schematic cross-sectional view for explaining a cross-sectional structure of the transistors according to a first modification of the first embodiment.

In the above, the first embodiment has been described. In the present disclosure, the capacitance between the transistors is preferably large. To increase the capacitance, it is effective to increase the junction depth of the impurity diffusion layer constituting the transistor. FIG. 14 illustrates an example case where the junction depth of the impurity diffusion layer is made deeper than that in FIG. 5. An impurity diffusion layer that forms the source/drain region of the drive transistor $TR_D$ and an impurity diffusion layer that forms the source/drain region of the write transistor $TR_W$ are preferably set to have a junction depth of greater than or equal to 1 micrometer.

In a configuration in which the capacitance is secured by the area of the planar layout, the capacitance decreases as the definition becomes higher. On the other hand, in the configuration of the present disclosure in which the capacitance is secured in the vertical direction by the junction depth of the transistor, it is possible to achieve high definition while securing the capacitance.

Second Embodiment

A second embodiment relates to a display element, a display device, and an electronic device according to a second aspect of the present disclosure.

In the second embodiment, the drive unit further includes a switching transistor connected between the feeder line and the first source/drain region of the drive transistor. The above point is mainly different from the first embodiment.

Figure 15:
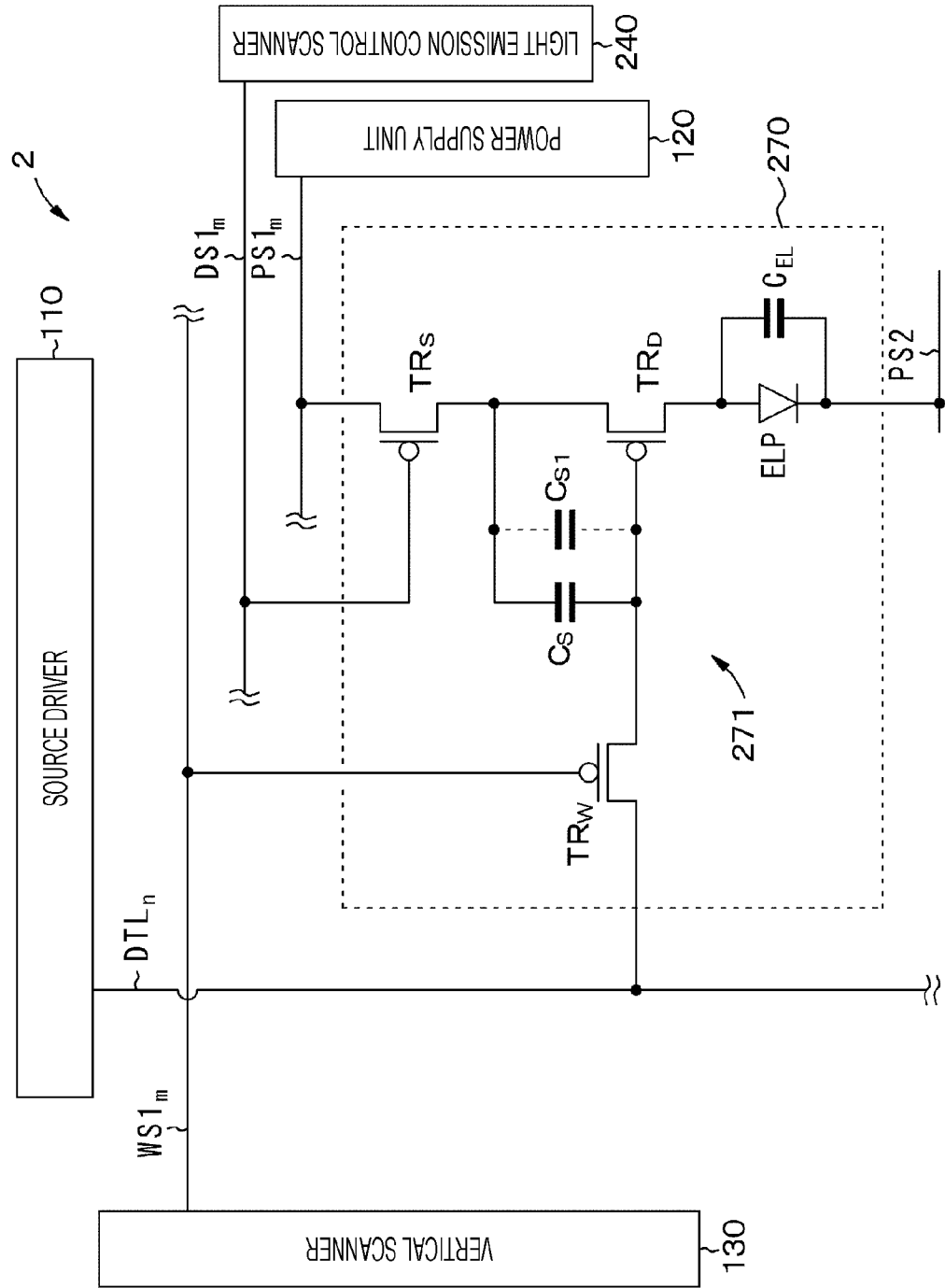
FIG. 15 is a conceptual diagram of a display device according to a second embodiment.

FIG. 15 is a conceptual diagram of a display device according to the second embodiment. Note that, for convenience of illustration, FIG. 15 illustrates a connection relationship for one display element 270 in a display device 2, more specifically, the (n, m)-th display element 270.

In the second embodiment, a drive unit 271 includes a switching transistor $TR_S$ connected between the feeder line PS1 and the first source/drain region 23A of the drive transistor $TR_D$. The conductivity type of the switching transistor is not particularly limited, but the switching transistor $TR_S$ is preferably include a p-channel field effect transistor from a viewpoint of standardization of the semiconductor manufacturing process. The conductive state/non-conductive state of the switching transistor $TR_S$ is controlled by a signal supplied to the gate electrode from a light emission control scanner 240 via the control line DS1, and for example, operation can be performed of reducing characteristic variation for each drive unit.

Figure 16:
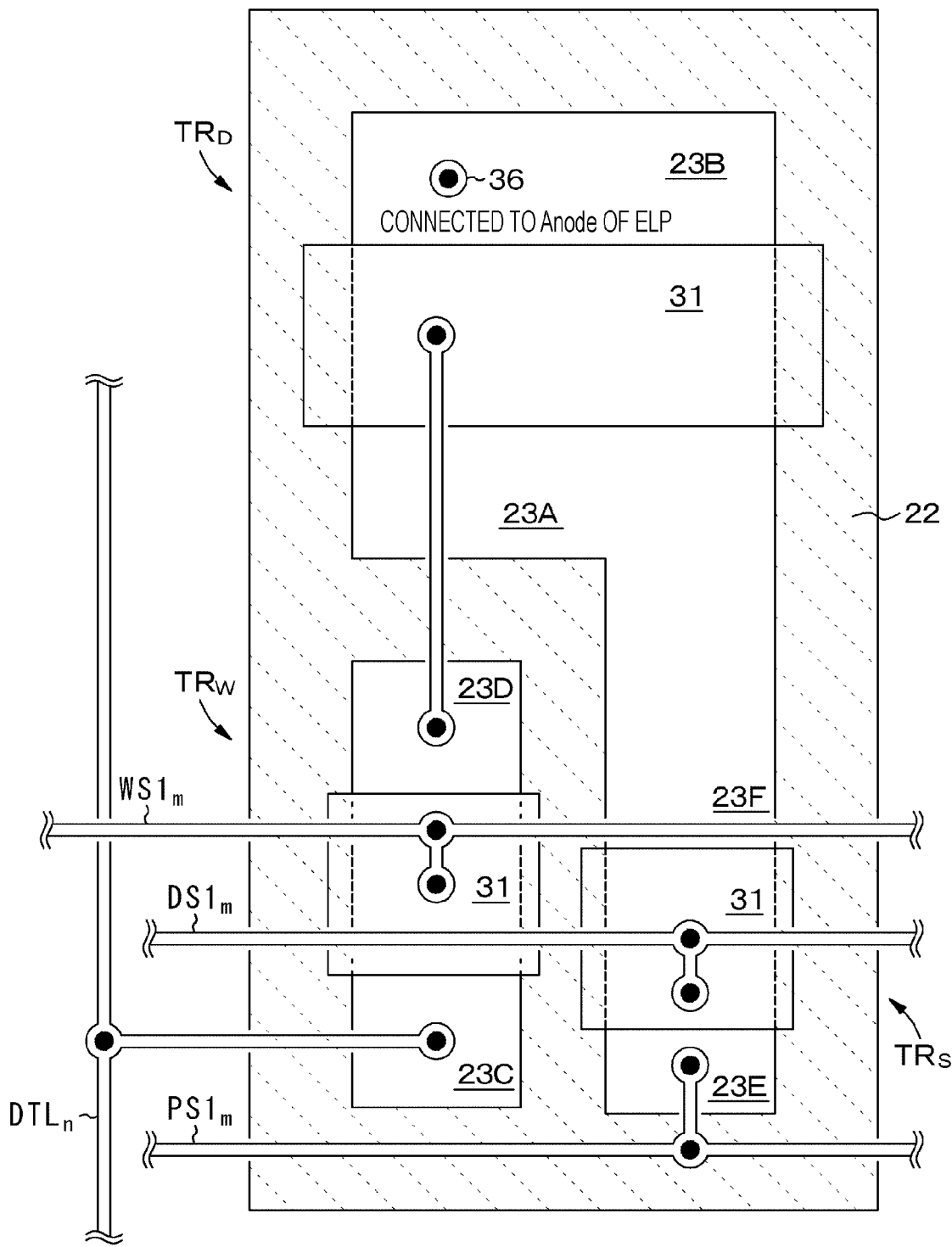
FIG. 16 is a schematic plan view for explaining an arrangement of the transistors in a drive unit according to the second embodiment.

FIG. 16 is a schematic plan view for explaining an arrangement of the transistors in the drive unit according to the second embodiment. Reference numerals 23E and 23F denote a pair of source/drain regions of the switching transistor $TR_S$. Also in this arrangement, the capacitance between the transistors functions as a part of the capacitance unit.

Third Embodiment

A third embodiment relates to a display element, a display device, and an electronic device according to a third aspect of the present disclosure.

In the third embodiment, the drive unit further includes a switching transistor connected between the one end of the light-emitting unit and the second source/drain region of the drive transistor. The above point is mainly different from the first embodiment.

Figure 17:
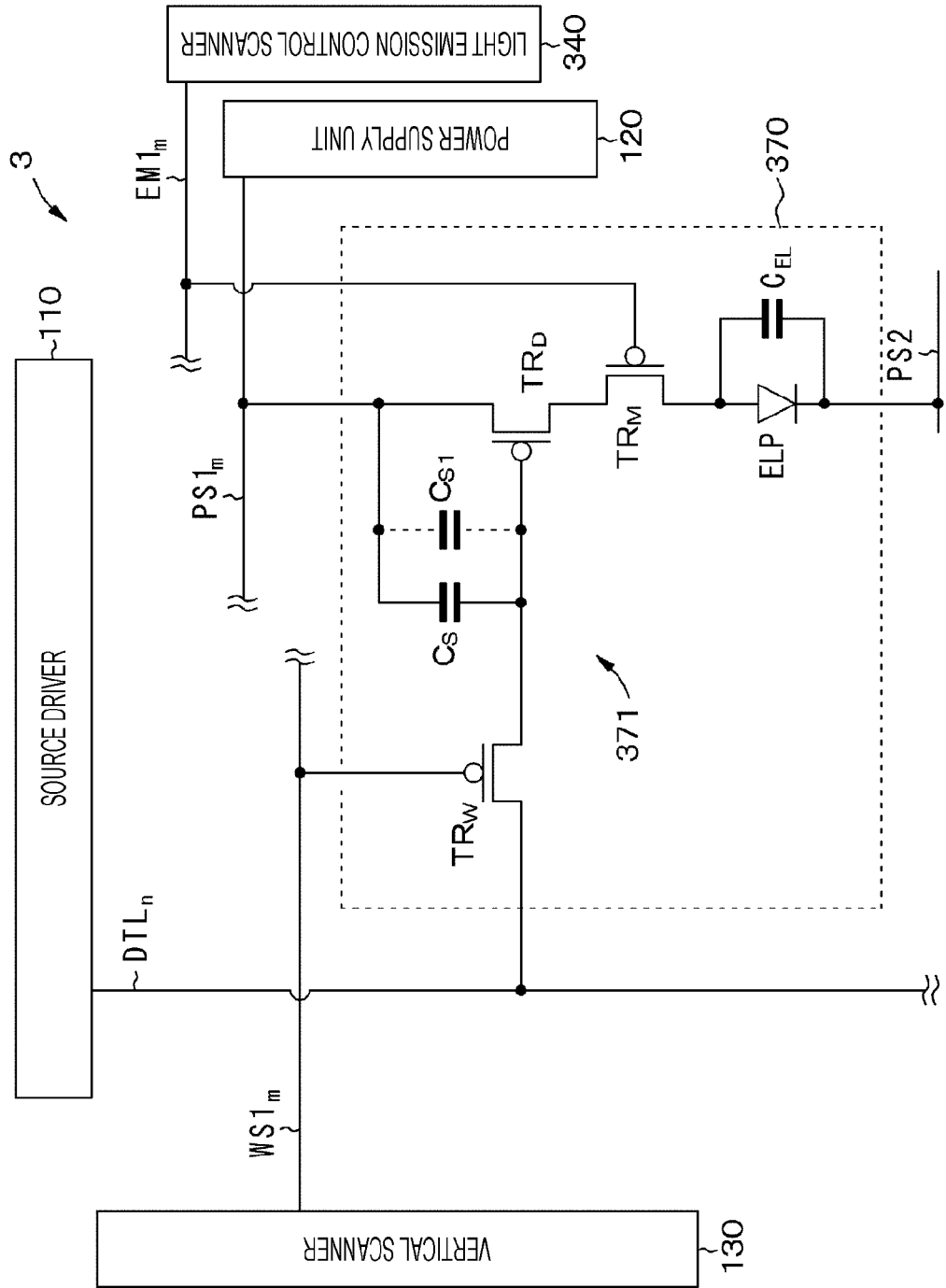
FIG. 17 is a conceptual diagram of a display device according to a third embodiment.

FIG. 17 is a conceptual diagram of the display device according to the third embodiment. Note that, for convenience of illustration, FIG. 17 illustrates a connection relationship for one display element 370 in a display device 3, more specifically, the (n, m)-th display element 370.

In the third embodiment, a drive unit 371 includes a switching transistor $TR_M$ connected between one end of the light-emitting unit ELP and the second source/drain region 23D of the drive transistor $TR_D$. The conductivity type of the switching transistor is not particularly limited, but the switching transistor $TR_M$ is preferably a p-channel field effect transistor from the viewpoint of standardization of the semiconductor manufacturing process. The conductive state/non-conductive state of the switching transistor $TR_M$ is controlled by a signal supplied to the gate electrode from a light emission control scanner 340 via the control line EM1, and for example, operation can be performed of reducing characteristic variation for each drive unit.

Figure 18:
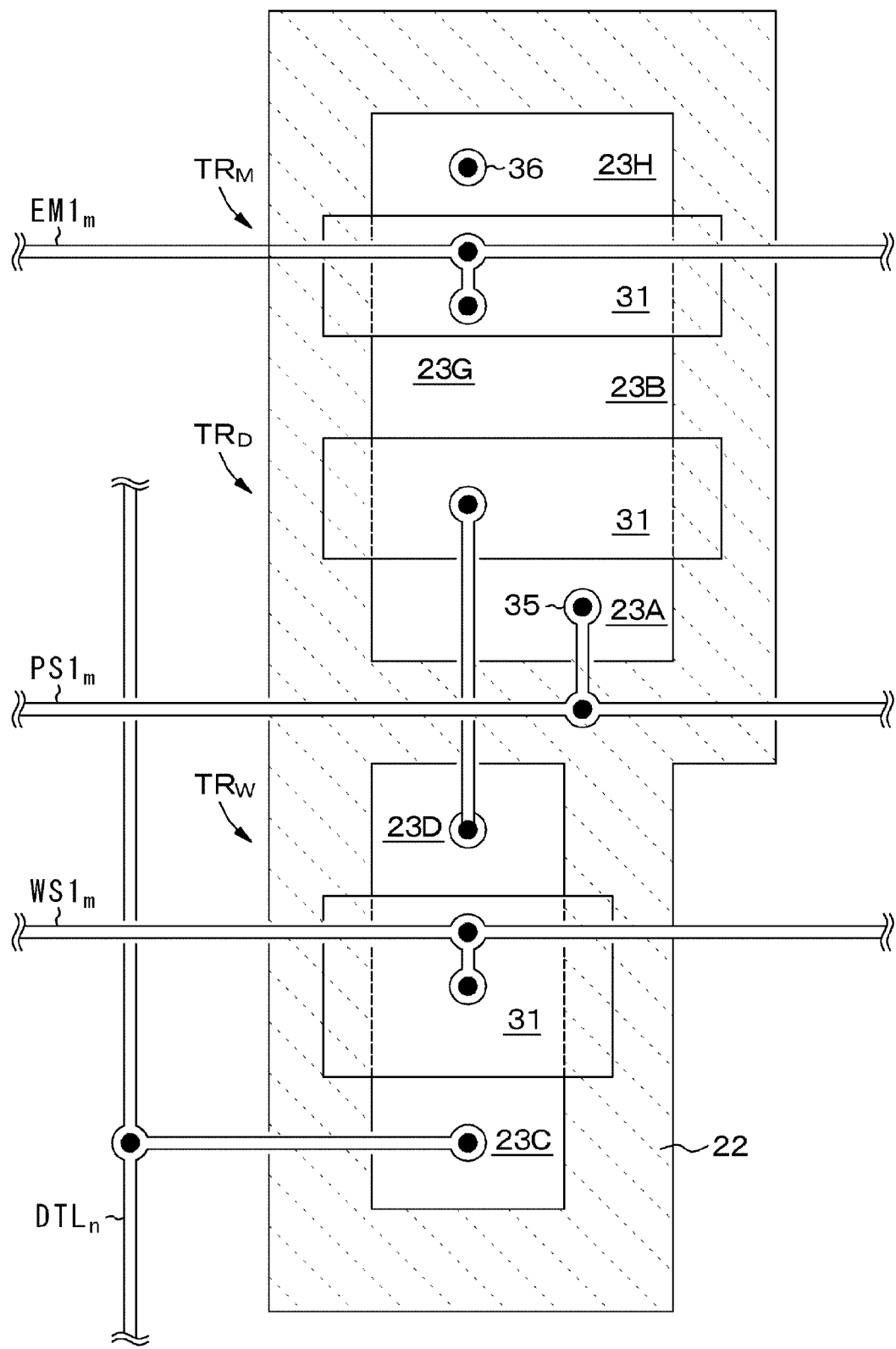
FIG. 18 is a schematic plan view for explaining an arrangement of the transistors in a drive unit according to the third embodiment.

FIG. 18 is a schematic plan view for explaining an arrangement of the transistors in the drive unit according to the third embodiment. Reference numerals 23G and 23H denote a pair of source/drain regions of the switching transistor $TR_M$. Also in this arrangement, the capacitance between the transistors functions as a part of the capacitance unit.

[Electronic Device]

The display device of the present disclosure described above can be used as a display unit (display device) of an electronic device in all fields, the display unit displaying a video signal input to the electronic device or a video signal generated in the electronic device as an image or a video. For example, the display device can be used as a display unit of a television set, a digital still camera, a laptop personal computer, a mobile terminal device such as a mobile phone, a video camera, a head mounted display, and the like.

The display device of the present disclosure also includes a module shape display device having a sealed configuration. An example is a display module in which a facing unit such as transparent glass is attached to a pixel array unit. Note that, the display module may be provided with a circuit unit for inputting/outputting a signal and the like to the pixel array unit from the outside, a flexible printed circuit (FPC), and the like. As a specific example of the electronic device using the display device of the present disclosure, a digital still camera and a head mounted display will be exemplified below. However, the specific example exemplified here is merely an example, and the electronic device is not limited to the example.

Specific Example 1

Figure 19A:
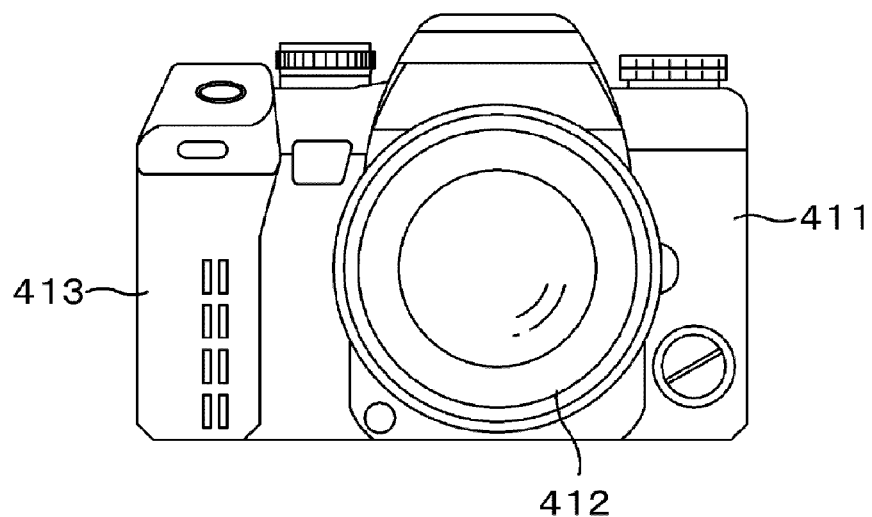
FIGS. 19A-B are external views of a lens interchangeable single lens reflex type digital still camera.
Figure 19B:
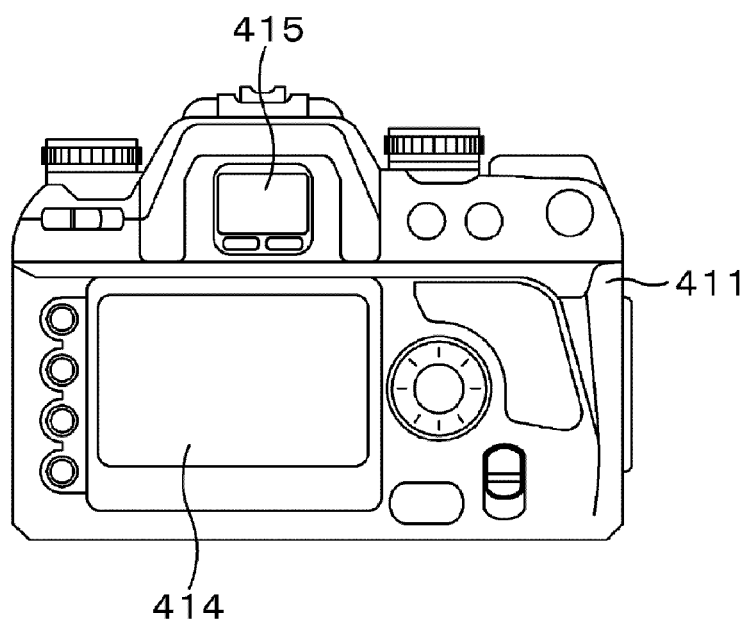

FIGS. 19A-B are external views of a lens interchangeable single lens reflex type digital still camera, and FIG. 19A illustrates a front view of the camera and FIG. 19B illustrates a rear view of the camera. The lens interchangeable single lens reflex type digital still camera includes an interchangeable imaging lens unit (interchangeable lens) 412 on the front right side of the camera body part (camera body) 411, and includes a grip part 413 to be held by an image-capturing person on the front left side, for example.

Then, a monitor 414 is provided substantially at the center of the rear surface of the camera body part 411. A viewfinder (eyepiece window) 415 is provided on the top of the monitor 414. The image-capturing person can look in the viewfinder 415, to visually recognize an optical image of a subject guided from the imaging lens unit 412 and determine composition.

In the lens interchangeable single lens reflex type digital still camera with the above configuration, the display device of the present disclosure can be used as the viewfinder 415. That is, the lens interchangeable single lens reflex type digital still camera according to this example is manufactured by using the display device of the present disclosure as the viewfinder 415.

Specific Example 2

Figure 20:
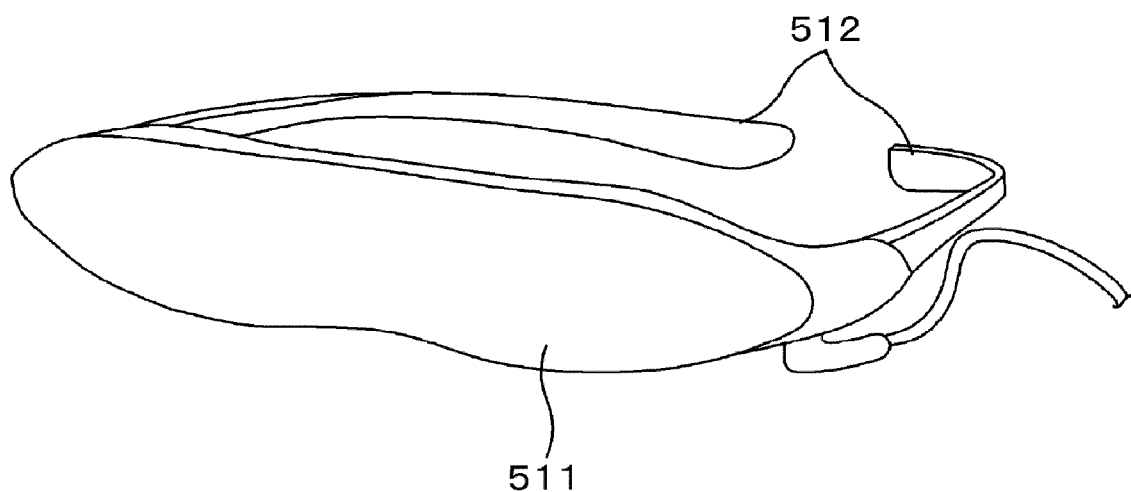
FIG. 20 is an external view of a head mounted display.

FIG. 20 is an external view of a head mounted display. The head mounted display includes, for example, an ear hooking part 512 for mounting on the head of a user on both sides of an eyeglass-shaped display unit 511. In this head mounted display, the display device of the present disclosure can be used as the display unit 511. That is, the head mounted display according to this example is manufactured by using the display device of the present disclosure as the display unit 511.

Specific Example 3

Figure 21:
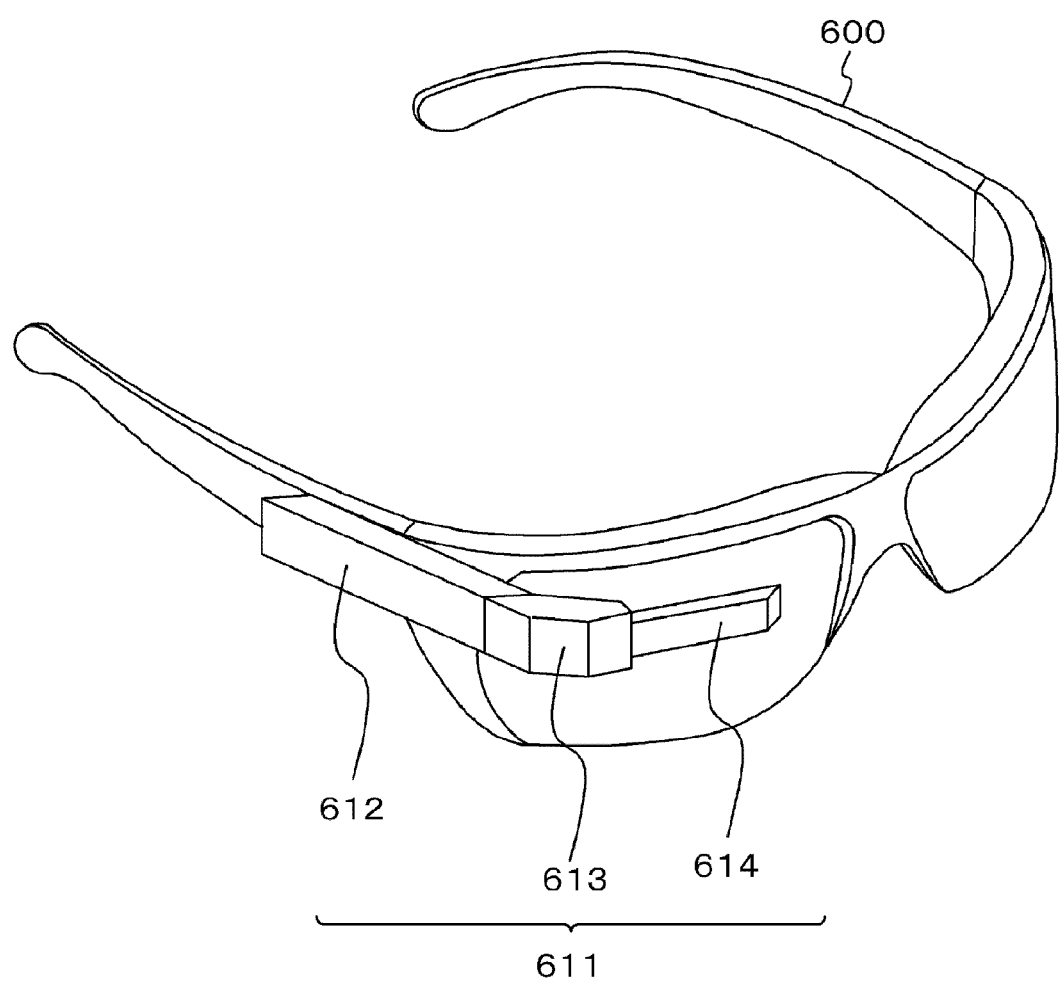
FIG. 21 is an external view of a see-through head mounted display.

FIG. 21 is an external view of a see-through head mounted display. A see-through head mounted display 611 includes a body part 612, an arm 613, and a lens barrel 614.

The body part 612 is connected to the arm 613 and eyeglasses 600. Specifically, an end portion in a long side direction of the body part 612 is coupled to the arm 613, and one side surface of the body part 612 is connected to the eyeglasses 600 via a connection member. Note that, the body part 612 may be directly mounted to the head of a human body.

The body part 612 incorporates a control board for controlling operation of the see-through head mounted display 611 and a display unit. The arm 613 connects the body part 612 and the lens barrel 614 together, and supports the lens barrel 614. Specifically, the arm 613 is coupled to each of the end portion of the body part 612 and an end portion of the lens barrel 614, and fixes the lens barrel 614. Furthermore, the arm 613 incorporates a signal line for communicating data related to an image provided from the body part 612 to the lens barrel 614.

The lens barrel 614 projects image light provided from the body part 612 via the arm 613 toward eyes of a user wearing the see-through head mounted display 611 through an eyepiece. In the see-through head mounted display 611, the display device of the present disclosure can be used for the display unit of the body part 612.

[Others]

Note that, the technology of the present disclosure can also adopt the following configurations.

[A1]

A display element including:

a light-emitting unit of a current drive type; and a drive unit that drives the light-emitting unit, in which the drive unit includes a capacitance unit, a drive transistor that causes a current corresponding to a voltage held by the capacitance unit to flow through the light-emitting unit, and a write transistor that writes a signal voltage to the capacitance unit, the drive transistor and the write transistor are formed in a state of being separated by an element isolation region, on a semiconductor substrate, and a capacitance generated in a portion where the drive transistor and the write transistor face each other through the element isolation region functions as at least a part of the capacitance unit.

[A2]

The display element according to [A1], in which the drive transistor and the write transistor are provided in a well formed in the semiconductor substrate, the drive transistor includes a first source/drain region to which a feeder line is connected and a second source/drain region connected to one end of the light-emitting unit, the write transistor includes a first source/drain region to which the signal voltage is supplied externally and a second source/drain region connected to a gate electrode of the drive transistor, and the second source/drain region of the write transistor and the first source/drain region of the drive transistor are formed to face each other through the element isolation region.

[A3]

The display element according to [A1] or [A2], in which the element isolation region is formed by a shallow trench isolation (STI) structure in which an insulator is embedded in a groove dug in a surface of the semiconductor substrate.

[A4]

The display element according to any of [A1] to [A3], in which an impurity diffusion layer that forms a source/drain region of the drive transistor and an impurity diffusion layer that forms a source/drain region of the write transistor are set to have a junction depth of greater than or equal to 1 micrometer.

[A5]

The display element according to any of [A1] to [A4], in which the drive transistor includes a p-channel field effect transistor.

[A6]

The display element according to any of [A1] to [A5], in which the write transistor includes a p-channel field effect transistor.

[A7]

The display element according to any of [A2] to [A6], in which a shield wiring line is provided around a gate wiring line that connects the second source/drain region of the write transistor and the gate electrode of the drive transistor to each other.

[A8]

The display element according to any of [A7], in which the shield wiring line is connected to the feeder line.

[A9]

The display element according to any of [A2] to [A8], in which the drive unit further includes a switching transistor connected between the feeder line and the first source/drain region of the drive transistor.

[A10]

The display element according to any of [A2] to [A8], in which the drive unit further includes a switching transistor connected between the one end of the light-emitting unit and the second source/drain region of the drive transistor.

[A11]

The display element according to any of [A1] to [A10], in which the light-emitting unit includes an organic electroluminescence element.

[B1]

A display device including display elements arrayed in a two-dimensional matrix, in which the display elements each include a light-emitting unit of a current drive type, and a drive unit that drives the light-emitting unit, the drive unit includes a capacitance unit, a drive transistor that causes a current corresponding to a voltage held by the capacitance unit to flow through the light-emitting unit, and a write transistor that writes a signal voltage to the capacitance unit, the drive transistor and the write transistor are formed in a state of being separated by an element isolation region, on a semiconductor substrate, and a capacitance generated in a portion where the drive transistor and the write transistor face each other through the element isolation region functions as at least a part of the capacitance unit.

[B2]

The display device according to [B1], in which the drive transistor and the write transistor are provided in a well formed in the semiconductor substrate, the drive transistor includes a first source/drain region to which a feeder line is connected and a second source/drain region connected to one end of the light-emitting unit, the write transistor includes a first source/drain region to which the signal voltage is supplied externally and a second source/drain region connected to a gate electrode of the drive transistor, and the second source/drain region of the write transistor and the first source/drain region of the drive transistor are formed to face each other through the element isolation region.

[B3]

The display device according to [B1] or [B2], in which the element isolation region is formed by a shallow trench isolation (STI) structure in which an insulator is embedded in a groove dug in a surface of the semiconductor substrate.

[B4]

The display device according to any of [B1] to [B3], in which an impurity diffusion layer that forms a source/drain region of the drive transistor and an impurity diffusion layer that forms a source/drain region of the write transistor are set to have a junction depth of greater than or equal to 1 micrometer.

[B5]

The display device according to any of [B1] to [B4], in which the drive transistor includes a p-channel field effect transistor.

[B6]

The display device according to any of [B1] to [B5], in which the write transistor includes a p-channel field effect transistor.

[B7]

The display device according to any of [B2] to [B6], in which a shield wiring line is provided around a gate wiring line that connects the second source/drain region of the write transistor and the gate electrode of the drive transistor to each other.

[B8]

The display device according to any of [B7], in which the shield wiring line is connected to the feeder line.

[B9]

The display device according to any of [B2] to [B8], in which the drive unit further includes a switching transistor connected between the feeder line and the first source/drain region of the drive transistor.

[B10]

The display device according to any of [B2] to [B8], in which the drive unit further includes a switching transistor connected between the one end of the light-emitting unit and the second source/drain region of the drive transistor.

[B11]

The display device according to any of [B1] to [B10], in which the light-emitting unit includes an organic electroluminescence element.

[C1]

An electronic device including
a display device including display elements arrayed in a two-dimensional matrix, in which
the display elements each include a light-emitting unit of a current drive type, and a drive unit that drives the light-emitting unit,
the drive unit includes a capacitance unit, a drive transistor that causes a current corresponding to a voltage held by the capacitance unit to flow through the light-emitting unit, and a write transistor that writes a signal voltage to the capacitance unit,
the drive transistor and the write transistor are formed in a state of being separated by an element isolation region, on a semiconductor substrate, and
a capacitance generated in a portion where the drive transistor and the write transistor face each other through the element isolation region functions as at least a part of the capacitance unit.

[C2]

The electronic device according to [C1], in which
the drive transistor and the write transistor are provided in a well formed in the semiconductor substrate,
the drive transistor includes a first source/drain region to which a feeder line is connected and a second source/drain region connected to one end of the light-emitting unit,
the write transistor includes a first source/drain region to which the signal voltage is supplied externally and a second source/drain region connected to a gate electrode of the drive transistor, and
the second source/drain region of the write transistor and the first source/drain region of the drive transistor are formed to face each other through the element isolation region.

[C3]

The electronic device according to [C1] or [C2], in which
the element isolation region is formed by a shallow trench isolation (STI) structure in which an insulator is embedded in a groove dug in a surface of the semiconductor substrate.

[C4]

The electronic device according to any of [C1] to [C3], in which
an impurity diffusion layer that forms a source/drain region of the drive transistor and an impurity diffusion layer that forms a source/drain region of the write transistor are set to have a junction depth of greater than or equal to 1 micrometer.

[C5]

The electronic device according to any of [C1] to [C4], in which
the drive transistor includes a p-channel field effect transistor.

[C6]

The electronic device according to any of [C1] to [C5], in which
the write transistor includes a p-channel field effect transistor.

[C7]

The electronic device according to any of [C2] to [C6], in which
a shield wiring line is provided around a gate wiring line that connects the second source/drain region of the write transistor and the gate electrode of the drive transistor to each other.

[C8]

The electronic device according to any of [C7], in which
the shield wiring line is connected to the feeder line.

[C9]

The electronic device according to any of [C2] to [C8], in which
the drive unit further includes a switching transistor connected between the feeder line and the first source/drain region of the drive transistor.

[C10]

The electronic device according to any of [C2] to [C8], in which
the drive unit further includes a switching transistor connected between the one end of the light-emitting unit and the second source/drain region of the drive transistor.

[C11]

The electronic device according to any of [C1] to [C10], in which
the light-emitting unit includes an organic electroluminescence element.

REFERENCE SIGNS LIST 1, 2, 3, 9 Display device
10 Base material
20 Semiconductor layer
21 N well
22 Element isolation region
23A, 23B, 23C, 23D, 23E, 23F, 23G, 23H Source/drain region
31 Gate insulating layer
31' Insulating layer
32 Gate electrode
32' Second electrode
33 Interlayer insulating layer
34 First electrode
35, 36 Contact hole
37 Wiring line
38 Shield wiring line
40 Interlayer insulating layer
51 Anode electrode
52 Hole transporting layer, light emitting layer, and electron transporting layer
53 Cathode electrode
54 Second interlayer insulating layer
55, 56 Contact hole
60 Transparent substrate
70, 270, 370, 970 Display element
71, 271, 371, 971 Drive unit
80 Display area
100 Semiconductor substrate
110 Source driver
120 Power supply unit
130 Vertical scanner
240, 340 Light emission control scanner
$TR_W$ Write transistor
$TR_D$ Drive transistor
$C_S$ Capacitance unit
ELP Organic electroluminescence light-emitting unit
$C_{EL}$ Capacitance of light-emitting unit ELP
$C_{GA}$ Capacitance of reference example
$C_{S1}$ Capacitance
$TR_S$, $TR_M$ Switching transistor
WS1 Scanning line
DTL Data line
PS1 Feeder line
PS2 Common feeder line
DS1, ME1 Control line 411 Camera body part
412 Imaging lens unit
413 Grip part
414 Monitor
415 Viewfinder
511 Eyeglass-shaped display unit
512 Ear hooking part
600 Eyeglasses
611 See-through head mounted display
612 Body part
613 Arm
614 Lens barrel

The invention claimed is:

1. A display device comprising:
a plurality of data lines extending in a first direction;
a plurality of control lines extending in a second direction different from the first direction;
a plurality of pixel circuits arranged in a matrix;
wherein each of the plurality of pixel circuits includes:
a light emitting element,
a first transistor, a second transistor and a third transistor, and
a capacitor configured to store data voltage supplied from a corresponding one of the plurality of data lines,
wherein a channel length direction of each of the first transistor, the second transistor and the third transistor extends in the first direction,
at least a portion of a channel region of the second transistor is parallel to a channel region of the third transistor in the second direction,
a portion of an element isolation region of a semiconductor substrate is arranged between one of a source or a drain of the first transistor and one of a source or a drain of the third transistor, and
each of a channel region of the first transistor and the channel region of the second transistor is part of island-shaped semiconductor layer on the semiconductor substrate in a plan view.

2. The display device according to claim 1, the one of the source or the drain of the first transistor is directly electrically connected to one of a source or a drain of the second transistor.

3. The display device according to claim 1, wherein one of the plurality of control lines corresponding to the second transistor is arranged to intersect the channel region of the third transistor.

4. The display device according to claim 1, wherein a first electrode of the capacitor is directly electrically connected to the one of the source or the drain of the first transistor.

5. The display device according to claim 1, wherein a second electrode of the capacitor is directly electrically connected to a gate of the first transistor.

6. The display device according to claim 1, wherein the third transistor is configured to control writing of the data voltage supplied from the corresponding one of the plurality of data lines into the capacitor.

7. The display device according to claim 1, wherein the first transistor and the second transistor are connected in series.

8. The display device according to claim 1, wherein the light emitting element, the first transistor and the second transistor are connected in series.

9. The display device according to claim 1, wherein a channel region of the third transistor is a part of the island-shaped semiconductor layer structurally separated from a semiconductor layer of the first transistor and a semiconductor layer of the second transistor.

10. A display device comprising:
a plurality of data lines extending in a first direction;
a plurality of control lines extending in a second direction different from the first direction;
a plurality of pixel circuits arranged in a matrix;
wherein each of the plurality of pixel circuits includes:
a light emitting element,
a first transistor, a second transistor and a third transistor, and
a capacitor configured to store data voltage supplied from a corresponding one of the plurality of data lines,
wherein a channel length direction of each of the first transistor, the second transistor and the third transistor extends in the first direction,
at least a portion of a channel region of the second transistor is parallel to a channel region of the third transistor in the second direction,
a portion of an element isolation region of a semiconductor substrate is arranged between one of a source or a drain of the first transistor and one of a source or a drain of the third transistor, and
a semiconductor layer of the first transistor and a semiconductor layer of the second transistor are not structurally separated by the element isolation region.

11. The display device according to claim 10, the one of the source or the drain of the first transistor is directly electrically connected to one of a source or a drain of the second transistor.

12. The display device according to claim 10, wherein one of the plurality of control lines corresponding to the second transistor is arranged to intersect the channel region of the third transistor.

13. The display device according to claim 10, wherein a first electrode of the capacitor is directly electrically connected to the one of the source or the drain of the first transistor.

14. The display device according to claim 10, wherein a second electrode of the capacitor is directly electrically connected to a gate of the first transistor.

15. The display device according to claim 10, wherein the third transistor is configured to control writing of data voltage supplied from the corresponding one of the plurality of data lines into the capacitor.

16. The display device according to claim 10, wherein the first transistor and the second transistor are connected in series.

17. The display device according to claim 10, wherein the light emitting element, the first transistor and the second transistor are connected in series.

18. The display device according to claim 10, wherein a channel region of the third transistor is a part of the island-shaped semiconductor layer structurally separated from a semiconductor layer of the first transistor and a semiconductor layer of the second transistor.

* * * * *